United States Patent
Haberern et al.

(10) Patent No.: US 10,115,860 B2
(45) Date of Patent: *Oct. 30, 2018

(54) HIGH VOLTAGE MONOLITHIC LED CHIP

(71) Applicant: Cree, Inc., Durham, NC (US)

(72) Inventors: Kevin W. Haberern, Cary, NC (US);
Matthew Donofrio, Raleigh, NC (US);
Bennett Langsdorf, Cary, NC (US);
Thomas Place, Franklinton, NC (US);
Michael John Bergmann, Raleigh, NC (US)

(73) Assignee: CREE, INC., Durham, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/647,823

(22) Filed: Jul. 12, 2017

(65) Prior Publication Data

US 2017/0309778 A1 Oct. 26, 2017

Related U.S. Application Data

(63) Continuation of application No. 14/050,001, filed on Oct. 9, 2013, now Pat. No. 9,728,676, which is a
(Continued)

(51) Int. Cl.
*H01L 31/0256* (2006.01)
*H01L 33/08* (2010.01)
(Continued)

(52) U.S. Cl.
CPC .......... *H01L 33/08* (2013.01); *H01L 25/0753* (2013.01); *H01L 33/405* (2013.01);
(Continued)

(58) Field of Classification Search
CPC ....... H01L 2924/00014; H01L 2924/00; H01L 2224/48091; H01L 2224/73265;
(Continued)

(56) References Cited

U.S. PATENT DOCUMENTS 8,563,339 B2 10/2013 Tarsa et al.
9,024,349 B2 5/2015 Chitnis et al.
(Continued)

FOREIGN PATENT DOCUMENTS

DE 102008005497 A1 7/2009
WO 2010151600 A1 12/2010

OTHER PUBLICATIONS

Non-Final Office Action for U.S. Appl. No. 14/050,001, dated Jul. 30, 2015, 18 pages.
(Continued)

*Primary Examiner* — Robert Bachner
(74) *Attorney, Agent, or Firm* — Withrow & Terranova, P.L.L.C.; Vincent K. Gustafson

(57) ABSTRACT

Monolithic LED chips are disclosed comprising a plurality of active regions on submount, wherein the submount comprises integral electrically conductive interconnect elements in electrical contact with the active regions and electrically connecting at least some of the active regions in series. The submount also comprises an integral insulator element electrically insulating at least some of the interconnect elements and active regions from other elements of the submount. The active regions are mounted in close proximity to one another with at least some of the active regions having a space between adjacent ones of the active regions that is 10 percent or less of the width of one or more of the active regions. The space is substantially not visible when the LED chip is emitting, such that the LED chips emits light similar to a filament.

25 Claims, 10 Drawing Sheets

Related U.S. Application Data continuation-in-part of application No. 13/168,689, filed on Jun. 24, 2011, now Pat. No. 8,686,429.

(51) Int. Cl.
*H01L 33/40* (2010.01)
*H01L 25/075* (2006.01)
*H01L 33/46* (2010.01)

(52) U.S. Cl.
CPC .... *H01L 33/46* (2013.01); *H01L 2224/32257* (2013.01); *H01L 2224/48091* (2013.01); *H01L 2224/48247* (2013.01); *H01L 2224/73265* (2013.01)

(58) Field of Classification Search
CPC .......... H01L 2924/12041; H01L 33/62; H01L 25/0753; H01L 2224/48247; H01L 2924/12042; H01L 33/20; H01L 33/22; H01L 33/32
See application file for complete search history.

(56) References Cited

U.S. PATENT DOCUMENTS

| | | | |
|---|---|---|---|
| 9,159,888 | B2 | 10/2015 | Chitnis et al. |
| 9,653,643 | B2 | 5/2017 | Bergmann et al. |
| 9,666,764 | B2 | 5/2017 | Bergmann et al. |
| 9,728,676 | B2 | 8/2017 | Haberern et al. |
| 2010/0144118 | A1 | 6/2010 | Yang et al. |
| 2010/0155746 | A1 | 6/2010 | Ibbetson et al. |
| 2010/0158437 | A1 | 6/2010 | Decorby |
| 2010/0163900 | A1 | 7/2010 | Seo et al. |
| 2011/0001422 | A1 | 1/2011 | Aanegola et al. |
| 2011/0084294 | A1 | 4/2011 | Yao |
| 2012/0086026 | A1 | 4/2012 | Engl et al. |
| 2015/0228876 | A1 | 8/2015 | Place et al. |
| 2017/0229431 | A1 | 8/2017 | Bergmann et al. |
| 2017/0271561 | A1 | 9/2017 | Bergmann et al. |

OTHER PUBLICATIONS

Final Office Action for U.S. Appl. No. 14/050,001, dated Jan. 29, 2016, 18 pages.

Non-Final Office Action for U.S. Appl. No. 14/050,001, dated Jun. 23, 2016, 15 pages.

Final Office Action for U.S. Appl. No. 14/050,001, dated Dec. 22, 2016, 15 pages.

Advisory Action and AFCP 2.0 Decision for U.S. Appl. No. 14/050,001, dated Mar. 8, 2017, 4 pages.

Notice of Allowance for U.S. Appl. No. 14/050,001, dated Mar. 28, 2017, 8 pages.

Corrected Notice of Allowance of U.S. Appl. No. 14/050,001, dated Jun. 9, 2017, 4 pages.

International Search Report for International Patent Application No. PCT/US2014/058896, dated Dec. 22, 2014, 13 pages.

International Preliminary Report on Patentability for International Patent Application No. PCT/US2014/058896, dated Apr. 12, 2016, 9 pages.

Non-Final Office Action for U.S. Appl. No. 14/691,314, dated May 2, 2018, 11 pages.

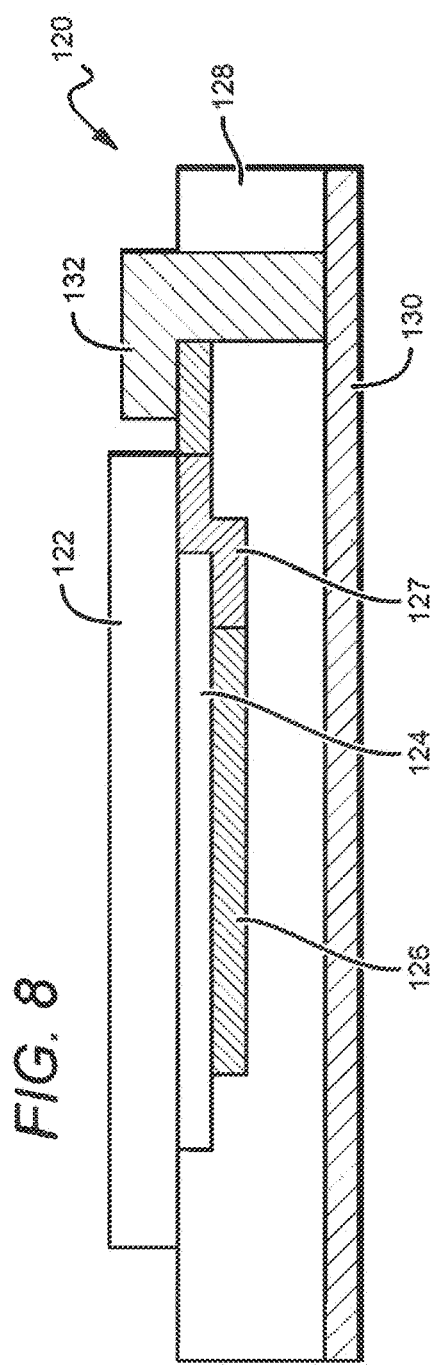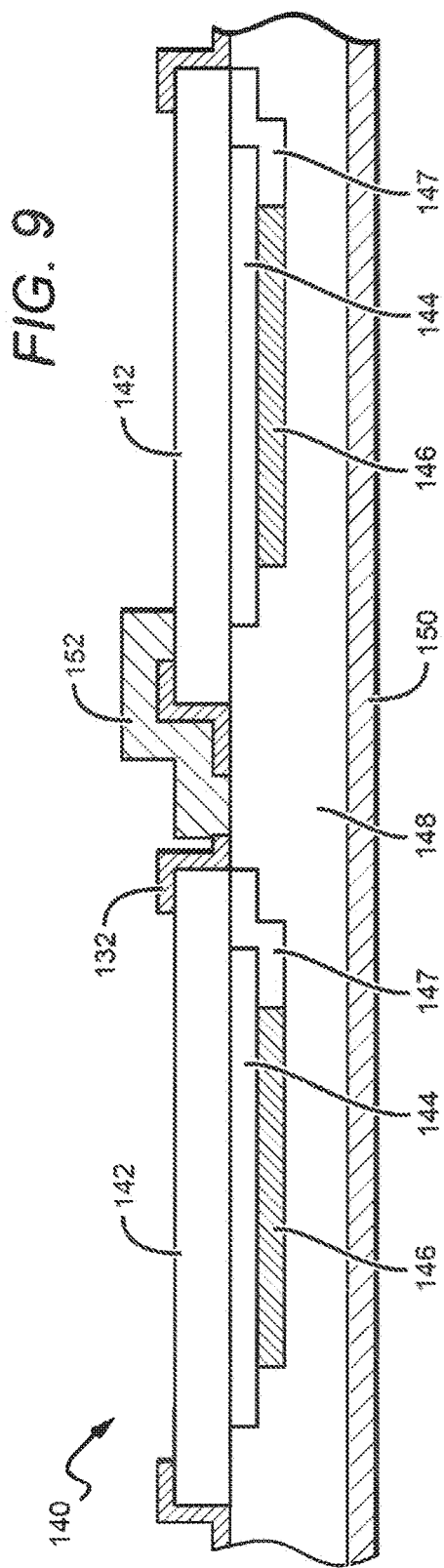

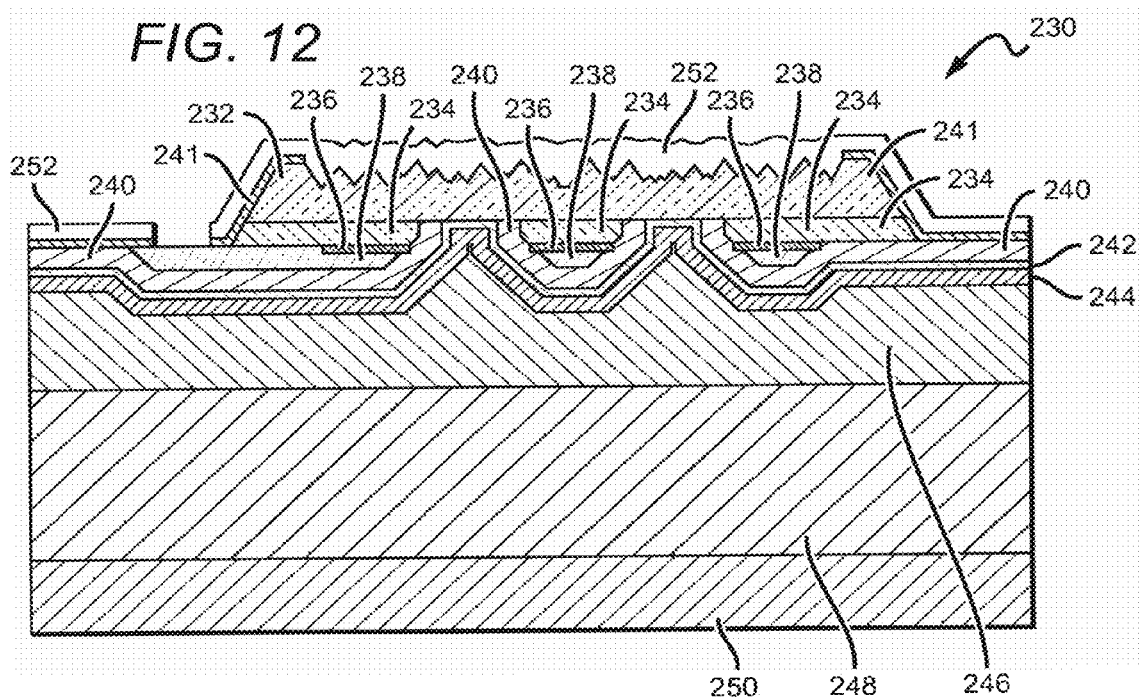
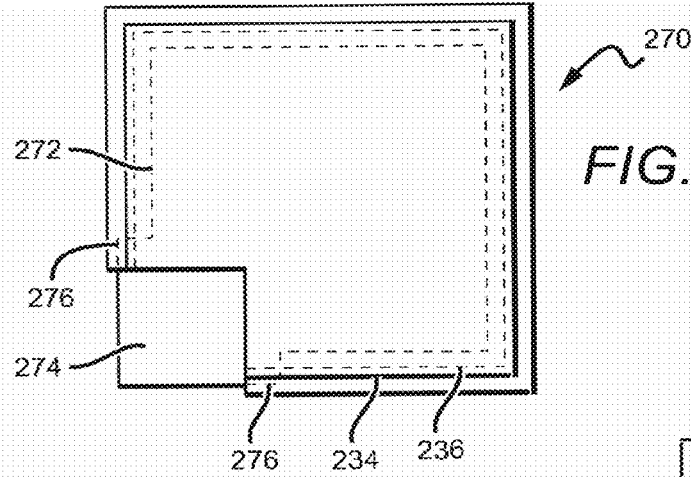
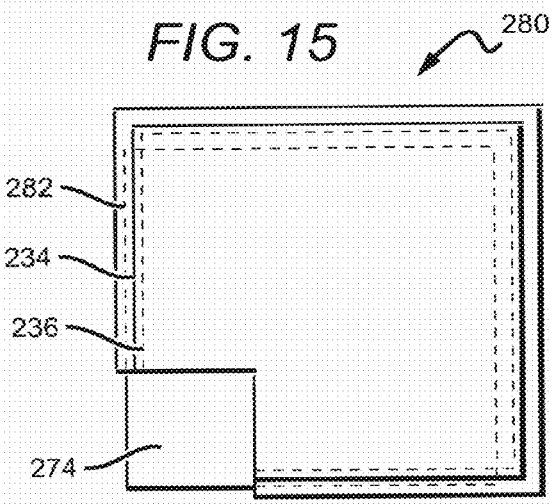

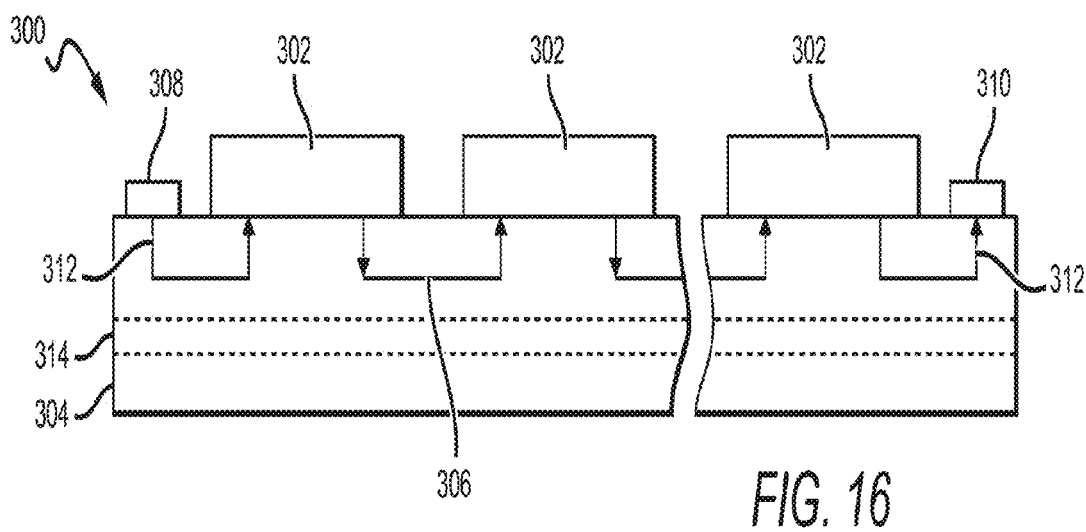
FIG. 16
FIG. 17
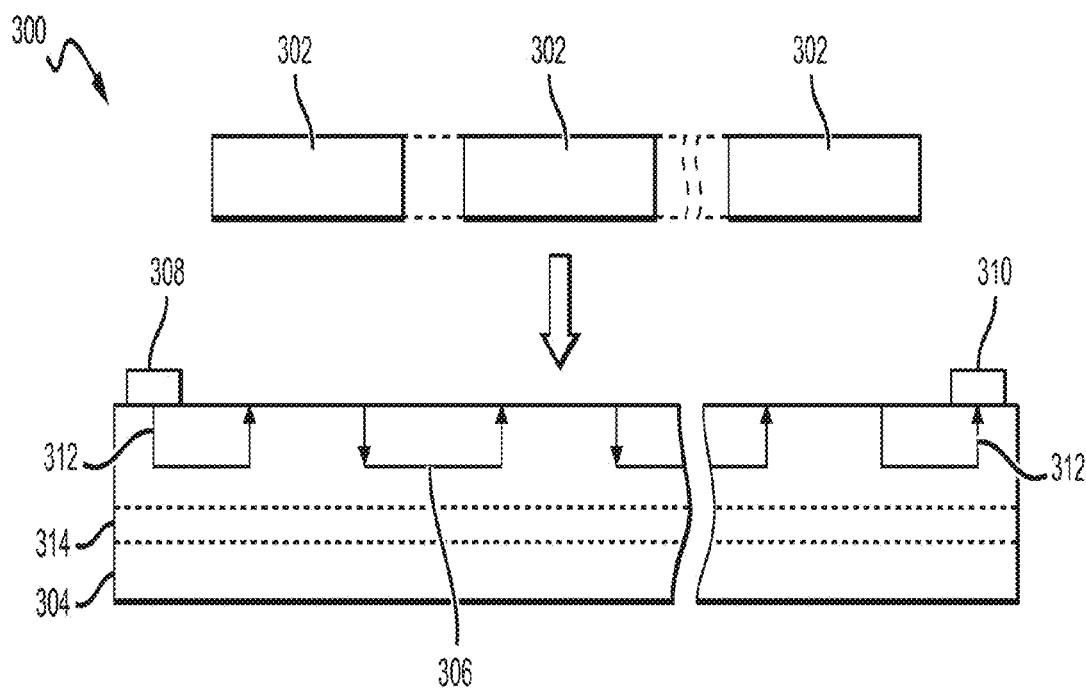

HIGH VOLTAGE MONOLITHIC LED CHIP

STATEMENT OF RELATED APPLICATION(S)

This application is a continuation of, and claims the benefit of, U.S. patent application Ser. No. 14/050,001 to Haberern et al., filed on Oct. 9, 2013 and published as U.S. Patent Application Publication No. 2014/0070245 A1, which itself is a continuation-in-part of, and claims the benefit of, U.S. patent application Ser. No. 13/168,689 to Bergmann et al., filed on Jun. 24, 2011, and subsequently issued as U.S. Pat. No. 8,686,429 on Apr. 1, 2014. The disclosures of the foregoing applications, publication, and patent are hereby incorporated by reference herein.

BACKGROUND OF THE INVENTION

Field of the Invention

This invention relates to monolithic light emitting diode (LED) chips, and in particular to high voltage monolithic LED chips with multiple active regions arranged in series and in close proximity.

Description of the Related Art

Light emitting diodes (LED or LEDs) are solid state devices that convert electric energy to light, and generally comprise one or more active layers of semiconductor material sandwiched between oppositely doped layers. When a bias is applied across the doped layers, holes and electrons are injected into the active layer where they recombine to generate light. Light is emitted from the active layer and from all surfaces of the LED.

For typical LEDs it is desirable to operate at the highest light emission efficiency, and one way emission efficiency can be measured is by the emission intensity in relation to the input power, or lumens per watt. One way to maximize emission efficiency is by maximizing extraction of light emitted by the active region of LEDs. For conventional LEDs with a single out-coupling surface, the external quantum efficiency can be limited by total internal reflection (TIR) of light from the LED's emission region. TIR can be caused by the large difference in the refractive index between the LED's semiconductor and surrounding ambient. Some LEDs have relatively low light extraction efficiencies because of the high index of refraction of the substrate compared to the index of refraction for the surrounding material (e.g. epoxy). This difference results in a small escape cone from which light rays from the active area can transmit from the substrate into the epoxy and ultimately escape from the LED package. Light that does not escape can be absorbed in the semiconductor material or at surfaces that reflect the light.

Different approaches have been developed to reduce TIR and improve overall light extraction, with one of the more popular being surface texturing. Surface texturing increases the light escape probability by providing a varying surface that allows photons multiple opportunities to find an escape cone. Light that does not find an escape cone continues to experience TIR, and reflects off the textured surface at different angles until finds an escape cone. The benefits of surface texturing have been discussed in several articles. [See Windisch et al., *Impact of Texture-Enhanced Transmission on High-Efficiency Surface Textured Light Emitting Diodes*, Appl. Phys. Lett., Vol. 79, No. 15, October 2001, Pgs. 2316-2317; Schnitzer et al. 30% *External Quantum Efficiency From Surface Textured, Thin Film Light Emitting Diodes*, Appl. Phys. Lett., Vol 64, No. 16, October 1993, Pgs. 2174-2176; Windisch et al. *Light Extraction Mechanisms in High-Efficiency Surface Textured Light Emitting Diodes*, IEEE Journal on Selected Topics in Quantum Electronics, Vol. 8, No. 2, March/April 2002, Pgs. 248-255; Streubel et al. *High Brightness AlGaNInP Light Emitting Diodes*, IEEE Journal on Selected Topics in Quantum Electronics, Vol. 8, No. March/April 2002]. Additionally, U.S. Pat. No. 6,657,236, also assigned to Cree Inc., discloses structures formed on the semiconductor layers for enhancing light extraction in LEDs.

Another way to increase light extraction efficiency is to provide reflective surfaces that reflect light so that it contributes to useful emission from the LED chip or LED package. In a typical LED package 10 illustrated in FIG. 1, a single LED chip 12 is mounted on a reflective cup 13 by means of a solder bond or conductive epoxy. One or more wire bonds 11 connect the ohmic contacts of the LED chip 12 to leads 15A and/or 15B, which may be attached to or integral with the reflective cup 13. The reflective cup may be filled with an encapsulant material 16 which may contain a wavelength conversion material such as a phosphor. Light emitted by the LED at a first wavelength may be absorbed by the phosphor, which may responsively emit light at a second wavelength. The entire assembly is then encapsulated in a clear protective resin 14, which may be molded in the shape of a lens to collimate the light emitted from the LED chip 12. While the reflective cup 13 may direct light in an upward direction, optical losses may occur when the light is reflected. Some light may be absorbed by the reflector cup due to the less than 100% reflectivity of practical reflector surfaces. Some metals can have less than 95% reflectivity in the wavelength range of interest.

FIG. 2 shows another conventional LED package 20 that may be more suited for high power operations that can generate more heat. In the LED package 20, one or more LED chips 22 are mounted onto a carrier such as a printed circuit board (PCB) carrier, substrate or submount 23. A reflector 24 can be included on the submount 23 that surrounds the LED chip(s) 22 and reflects light emitted by the LED chips 22 away from the package 20. Different reflectors can be used such as metal reflectors, omni-directional reflectors (ODRs), and distributed Bragg reflectors (DBRs). The reflector 24 can also provide mechanical protection to the LED chips 22. One or more wirebond connections 11 are made between ohmic contacts on the LED chips 22 and electrical traces 25A, 25B on the submount 23. The mounted LED chips 22 are then covered with an encapsulant 26, which may provide environmental and mechanical protection to the chips while also acting as a lens. The metal reflector 24 is typically attached to the carrier by means of a solder or epoxy bond.

The reflectors shown in FIGS. 1 and 2 are arranged to reflect light that escapes from the LED. LEDs have also been developed having internal reflective surfaces to reflect light internal to the LEDs. FIG. 3 shows a schematic of an LED chip 30 with an LED 32 mounted on a submount 34 by a metal bond layer 36. The LED further comprises a p-contact/reflector 38 between the LED 32 and the metal bond 36, with the reflector 38 typically comprising a metal such as silver (Ag). This arrangement is utilized in commercially available LEDs such as those from Cree® Inc., available under the EZBright™ family of LEDs. The reflector 38 can reflect light emitted from the LED chip toward the submount back toward the LED's primary emitting surface. The reflector also reflects TIR light back toward the LED's primary emitting surface. Like the metal reflectors above, reflector 38 reflects less than 100% of light and in some cases less than 95%. The reflectivity of a metal film on a semiconductor layer may be calculated from the materials' optical constants using thin film design software such as TFCalc™ from Software Spectra, Inc. (www.sspectra.com). U.S. Pat. No. 7,915,629, also assigned to Cree Inc. and fully incorporated herein by reference, further discloses a higher efficiency LED having a composite high reflectivity layer integral to the LED for improving emission efficiency.

In LED chips having a mirror contact to enhance reflectivity (e.g. U.S. Patent Publication No. 2009/0283787, which is incorporated in its entirety herein by reference), the light extraction and external quantum efficiency (EQE) is strongly affected by the reflectivity of the mirror. For example, in a mirror comprised of Ni/Ag, the reflectivity is dominated by the properties of the Ag, which is >90% reflective. However, as shown in FIG. 4, such a mirror 40 is traditionally bordered by a metal barrier layer 42 that encompasses the edges of the mirror, with the barrier layer 42 provided to prevent Ag migration during operation. The metal barrier layer 42 has much lower reflectivity than the mirror (e.g. 50% or lower), and the portions of the barrier layer 42 contacting the active layer 44 outside the mirror 40 periphery can have a negative effect on the overall efficiency of the LED chip. This is because such portions of the metal barrier layer 42 absorb many of the photons that would otherwise exit the chip. FIG. 5 depicts another LED chip 50 in the EZ family of Cree, Inc. lights, with the chip 50 comprising a mirror 52 disposed below an active region 54. As in FIG. 4, a barrier layer 56 is provided that borders mirror 52 as well as extending outside the periphery of the mirror. Those portions of the metal barrier layer extending beyond the edges of the mirror 52 can likewise absorb some of the light emitted from the LED(s) and impact the overall emitting efficiency of the chip.

In LED chips comprising a plurality of junctions or sub-LEDs, such as those disclosed in U.S. Pat. No. 7,985,970, and U.S. Patent Pub. No. 2010/0252840 (both assigned to Cree Inc. and incorporated entirely herein by reference), the effect of the metal barrier layer can be particularly pronounced. FIG. 6 depicts a monolithic LED chip comprising a plurality of sub-LEDs and a plurality of contact vias 62. Portions of barrier layers 64, as represented by the dark circles at the peripheries of the vias 62, are exposed and illustrate the dimming effect that can result from such exposure of the barrier layer. The effect can be very pronounced when comparing the efficiency of large, single-junction chips to multi-junction chips of the same footprint. This is because the smaller the junction is relative to the barrier layer exposed at the mirror periphery, the more severe the impact is on the overall emission efficiency of the device. For example, a 16-junction, 1.4 mm LED chip can be approximately 10% dimmer than a single-junction 1.4 mm chip.

SUMMARY OF THE INVENTION

Embodiments of the present invention are generally related to monolithic LED chips having a plurality of active areas on a substrate/submount ("submount") that can be interconnected in series. It is understood that other embodiment can have active regions interconnected in parallel or in a series parallel combination. The active areas can be arranged in close proximity such that space between adjacent ones of the active areas is substantially not visible when the emitter is emitting, thereby allowing the LED chip to emit light similar to that of a filament. Overall emission of the LEDs can also be improved by reducing the light-absorbing effects of materials, such as barrier layers, adjacent the mirror(s). Some embodiments are described below as having active regions arranged in a linearly, but it is understood that the LED chips according to the present invention can be arranged in many different shapes with their active regions arranged in many different locations and patterns in relation to one another. Some of the different shapes include different polygon shapes like triangle, square, rectangle, pentagon, etc.

One embodiment of a monolithic LED chip according to the present invention comprises a plurality of active regions on a submount. Integral electrically conductive interconnect elements are included in electrical contact with the active regions and electrically connecting at least some of the active region in series. One or more integral insulating layers are also included surrounding at least a portion of the interconnect elements and isolating the portion from other elements of the LED chip.

Another embodiment of a monolithic LED chip according to the present invention comprises a plurality of emitting active regions on a submount with at least some of the active regions interconnected in series. At least some of the active regions also have a space between adjacent ones of the active regions that is 10 percent or less of the width of one or more of the active regions, such that the space is substantially not visible when the LED chip is emitting.

One embodiment of a light source according to the present invention comprising a housing with an opening. A monolithic LED chip is mounted within the housing and emits out the opening. The LED chip comprises a plurality of active regions mounted on a submount in close proximity to one another such that the space between the active regions is substantially not visible when the active regions are emitting.

These and other aspects and advantages of the invention will become apparent from the following detailed description and the accompanying drawings which illustrate by way of example the features of the invention.

BRIEF DESCRIPTION OF THE DRAWINGS

FIG. 8 is a sectional view of another embodiment of an LED chip according to the present invention;

FIG. 9 is a sectional view of another embodiment of an LED chip according to the present invention;

FIG. 12 is a sectional view of another embodiment of an LED chip according to the present invention.

FIG. 14 is a top view of another embodiment of an LED chip according to the present invention;

FIG. 15 is a top view of still another embodiment of an LED chip according to the present invention;

FIG. 16 is a sectional view of one embodiment of a monolithic LED chip according to the present invention;

FIG. 17 is a sectional view of the LED chip shown in FIG. 16 at an intermediate manufacturing step;

DETAILED DESCRIPTION OF THE INVENTION

Figure 1:
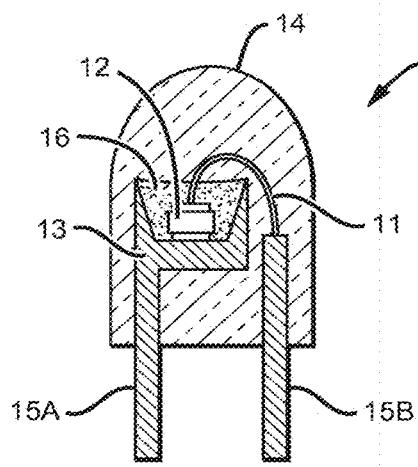
FIG. 1 is a sectional view of a prior art LED package.
Figure 2:
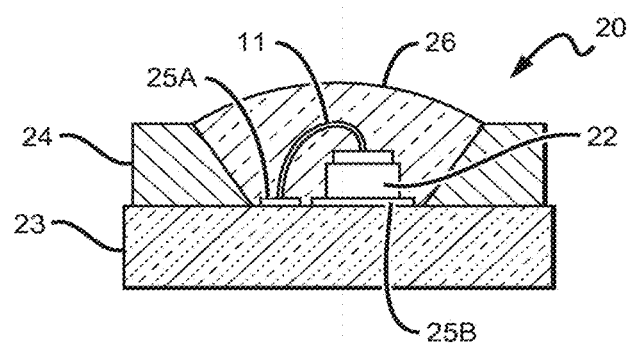
FIG. 2 is a sectional view of another prior art LED package.
Figure 3:
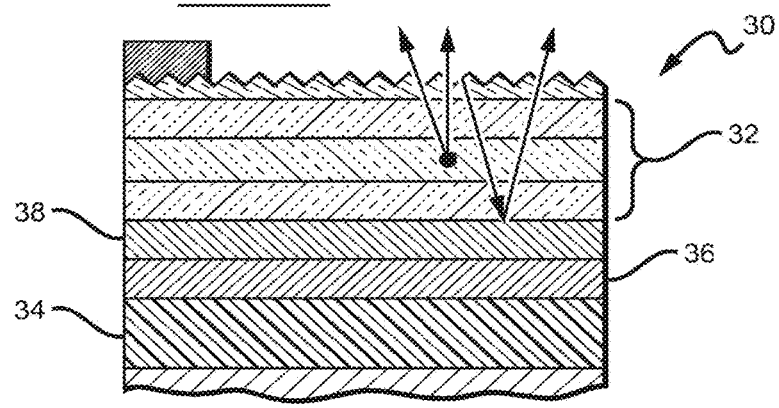
FIG. 3 a sectional view of another embodiment of a prior art LED chip.
Figure 4:
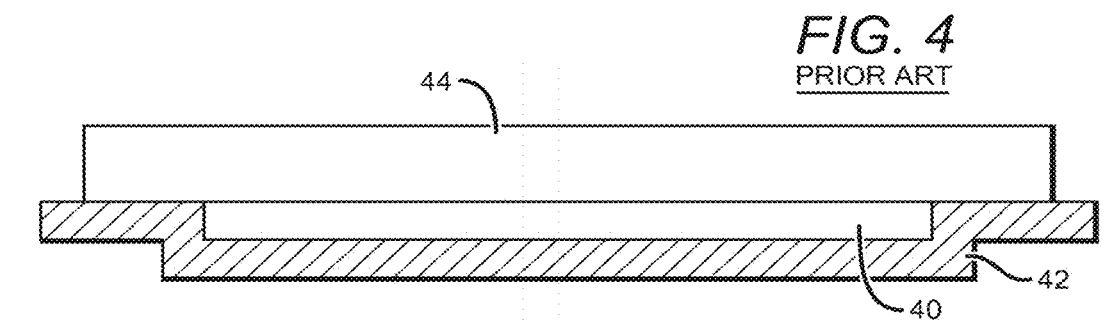
FIG. 4 is a sectional view of a prior art LED chip according to the present invention.
Figure 5:
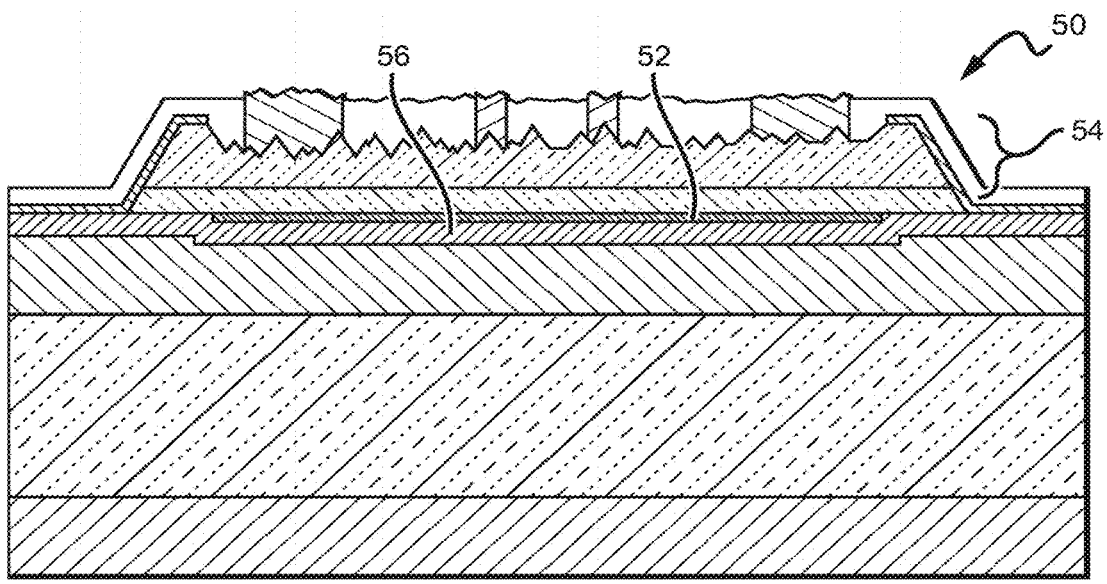
FIG. 5 is a sectional view of a prior art LED chip according to the present invention.

The present invention is described herein with reference to certain embodiments, but it is understood that the invention can be embodied in many different forms and should not be construed as limited to the embodiments set forth herein.

In some embodiments according to the present invention, LED chip structures are provided to enhance the overall emission characteristics of LEDs. The emission characteristics of LED chip structures having mirror reflectivity are generally enhanced by limiting the amount of dark or substantially non-reflective barrier material around the periphery of highly reflective mirror components. In LED chips having p-contacts with integral mirrors rather than ITO (such as in the EZ family of chips provided by Cree, Inc.), the light extraction and EQE is strongly affected by the reflective characteristics of the mirror. For example, in a mirror comprised of Ni/Ag, the reflectivity is dominated by the properties of the Ag and is believed to be around 90% reflective. This high reflectivity can be counteracted by a barrier layer, which is used to prevent Ag migration during operation of the LED chip at high temperatures and/or in humid conditions. The barrier layer, if allowed to extend substantially beyond the periphery of the mirror, can significantly adversely affect the reflectivity of the mirror since it generally has a reflectivity of 50% or lower and can absorb many of the photons that would otherwise be exiting and emitting from the chip.

Thus, in certain embodiments of LED chip structures according to the present invention, barrier layers are provided that are patterned smaller than the mirror layers they are protecting. As such, the barrier layers are preferably no longer wrapping around the edges of the mirror, and thus are not exposed to light trapped within the GaN active region. In still other embodiments, there can be multiple sub-LEDs connected via junctions to comprise one LED chip. In such structures, there will necessarily be a small portion of the barrier layer that is exposed outside a portion of the mirror periphery in order to create a connection between the p-contact of one LED and the n-contact of an adjacent LED. In such embodiments, the amount of the barrier that is exposed is minimized such that at least 40% of the mirror periphery is free from the barrier layer and its associated adverse effects. In other embodiments, at least 50% of the mirror periphery is free from the barrier layer, while in other embodiments at least 60% is free from the barrier layer.

In other embodiments, LED chips structures are provided having a plurality of active areas/portions/regions ("regions") that can be provided on a submount having internal and integral electrical interconnects to connect the LEDs in different series connections. In different embodiments, the active regions can be distinct from each other, with each having its own set of oppositely doped layers and active layer not otherwise connected to same layers in the other active regions.

The electrical interconnects can be arranged so that at least a portion is buried or surrounded in electrical insulating material. The submount can also have a barrier layer that does not extend beyond the edge of or wrap around the portions of the mirror layer, with the portion being particularly below the primary emission area of the active regions. This can help minimize the light that might be absorbed during operation, thereby increasing the overall emission efficiency of the active regions.

The submounts internal electrical connections can be particularly arranged to allow for interconnection of the active regions so that each is relatively close to the adjacent ones of the active regions. During emission of the monolithic LED chips according to the present invention, the small space between the active regions reduces or eliminates dark spots between the active regions so that the LEDs appear as a continuous light source. This arrangement allows for monolithic LEDs that give the appearance of a conventional filament light source, while at the same time maximizing the emission area of the LED chips to increase overall brightness.

It will be understood that when an element is referred to as being "on", "connected to", "coupled to", or "in contact with" another element, it can be directly on, connected or couple to, or in contact with the other element or intervening elements may be present. In contrast, when an element is referred to as being "directly on", "directly connected to", "directly coupled to", or "directly in contact with" another element, there are no intervening elements present. Likewise, when a first element is referred to as being "in electrical contact with" or "electrically coupled to" a second element, there is an electrical path that permits current flow between the first element and the second element. The electrical path may include capacitors, coupled inductors, and/or other elements that permit current flow even without direct contact between conductive elements.

Although the terms first, second, etc. may be used herein to describe various elements, components, regions, and/or sections, these elements, components, regions, and/or sections should not be limited by these terms. These terms are only used to distinguish one element, component, region, or section from another element, component, region, or section. Thus, a first element, component, region, or section discussed below could be termed a second element, component, regions, or section without departing from the teachings of the present invention.

Embodiments of the invention are described herein with reference to cross-sectional view illustrations that are schematic illustrations of embodiments of the invention. As such, the actual thickness of components can be different, and variations from the shapes of the illustrations as a result, for example, of manufacturing techniques and/or tolerances are expected. Embodiments of the invention should not be construed as limited to the particular shapes of the regions illustrated herein but are to include deviations in shapes that result, for example, from manufacturing. A region illustrated or described as square or rectangular will typically have rounded or curved features due to normal manufacturing tolerances. Thus, the regions illustrated in the figures are schematic in nature and their shapes are not intended to illustrate the precise shape of a region of a device and are not intended to limit the scope of the invention.

It is also understood that when an element such as a layer, region or substrate is referred to as being "on" another element, it can be directly on the other element or intervening elements may also be present. Furthermore, relative terms such as "inner", "outer", "upper", "above", "lower", "beneath", and "below", and similar terms, may be used herein to describe a relationship of one layer or another region. It is understood that these terms are intended to encompass different orientations of the device in addition to the orientation depicted in the figures.

LED structures, features, and their fabrication and operation are generally known in the art and only briefly discussed herein. LEDs can have many different semiconductor layers arranged in different ways and can emit different colors. The layers of the LEDs can be fabricated using known processes, with a suitable process being fabrication using metal organic chemical vapor deposition (MOCVD). The layers of the LED chips generally comprise an active layer/region sandwiched between first and second oppositely doped epitaxial layers, all of which are formed successively on a growth substrate or wafer. LED chips formed on a wafer can be singulated and used in different application, such as mounting in a package. It is understood that the growth substrate/wafer can remain as part of the final singulated LED or the growth substrate can be fully or partially removed.

It is also understood that additional layers and elements can also be included in the LEDs, including but not limited to buffer, nucleation, contact and current spreading layers as well as light extraction layers and elements. The active region can comprise single quantum well (SQW), multiple quantum well (MQW), double heterostructure or super lattice structures.

The active region and doped layers may be fabricated from different material systems, with one such system being Group-III nitride based material systems. Group-III nitrides refer to those semiconductor compounds formed between nitrogen and the elements in the Group III of the periodic table, usually aluminum (Al), gallium (Ga), and indium (In). The term also refers to ternary and quaternary compounds such as aluminum gallium nitride (AlGaN) and aluminum indium gallium nitride (AlInGaN). In a possible embodiment, the doped layers are gallium nitride (GaN) and the active region is InGaN. In alternative embodiments the doped layers may be AlGaN, aluminum gallium arsenide (AlGaAs) or aluminum gallium indium arsenide phosphide (AlGaInAsP) or aluminum indium gallium phosphide (AlInGaP) or zinc oxide (ZnO).

The growth substrate/wafer can be made of many materials such as silicon, glass, sapphire, silicon carbide, aluminum nitride (AlN), gallium nitride (GaN), with a suitable substrate being a 4H polytype of silicon carbide, although other silicon carbide polytypes can also be used including 3C, 6H and 15R polytypes. Silicon carbide has certain advantages, such as a closer crystal lattice match to Group III nitrides than sapphire and results in Group III nitride films of higher quality. Silicon carbide also has a very high thermal conductivity so that the total output power of Group-III nitride devices on silicon carbide is not limited by the thermal dissipation of the substrate (as may be the case with some devices formed on sapphire). SiC substrates are available from Cree Research, Inc., of Durham, N.C. and methods for producing them are set forth in the scientific literature as well as in a U.S. Pat. Nos. Re. 34,861; 4,946,547; and 5,200,022.

LEDs can also comprise additional features such as conductive current spreading structures, current spreading layers, and wire bond pads, all of which can be made of known materials deposited using known methods. Some or all of the LEDs can be coated with one or more phosphors, with the phosphors absorbing at least some of the LED light and emitting a different wavelength of light such that the LED emits a combination of light from the LED and the phosphor. LED chips can be coated with a phosphor using many different methods, with one suitable method being described in U.S. patent application Ser. Nos. 11/656,759 and 11/899,790, both entitled "Wafer Level Phosphor Coating Method and Devices Fabricated Utilizing Method" and subsequently issued as U.S. Pat. Nos. 9,024,349 and 9,159,888 respectively, with the foregoing applications and patents being incorporated herein by reference. Alternatively, the LEDs can be coated using other methods such as electrophoretic deposition (EPD), with a suitable EPD method described in U.S. patent application Ser. No. 11/473,089 entitled "Close Loop Electrophoretic Deposition of Semiconductor Devices", and subsequently issued as U.S. Pat. No. 8,563,339, with the foregoing application and patent also being incorporated herein by reference.

Furthermore, LEDs may have vertical or lateral geometry as is known in the art. Those comprising a vertical geometry may have a first contact on a substrate and a second contact on a p-type layer. An electrical signal applied to the first contact spreads into the n-type layer and a signal applied to the second contact spreads into a p-type layer. In the case of Group-III nitride devices, it is well known that a thin semitransparent typically covers some or the entire p-type layer. It is understood that the second contact can include such a layer, which is typically a metal such as platinum (Pt) or a transparent conductive oxide such as indium tin oxide (ITO).

LEDs may also comprise a lateral geometry, wherein both contacts are on the top of the LEDs. A portion of the p-type layer and active region is removed, such as by etching, to expose a contact mesa on the n-type layer. A second lateral n-type contact is provided on the mesa of the n-type layer. The contacts can comprise known materials deposited using known deposition techniques.

Figure 7:
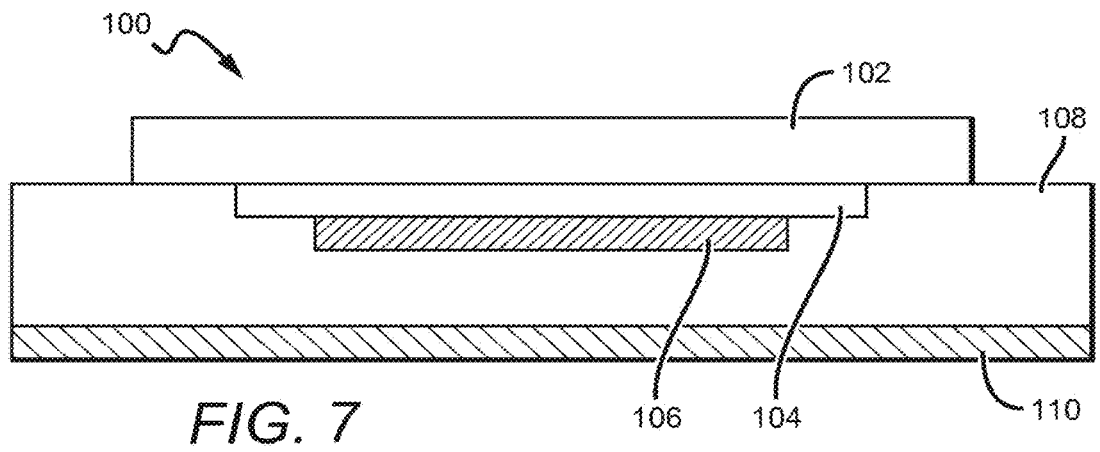
FIG. 7 is a sectional view of one embodiment of an LED chip according to the present invention.

FIG. 7 shows one possible embodiment of a LED chip 100 according to the present invention. LED chip 100 generally comprises a GaN active region 102, a Ni/Ag-based mirror contact 104, a metal barrier 106, an insulator 108, and a reflective metal 110. The structure depicted in FIG. 7 is intentionally simplified for illustrative purposes, and it is understood that a chip according to the present invention could include additional components as discussed above or below in more detail and/or as is well known in the art, and could likewise include other suitable materials as discussed above or below in more detail. Thus, it is understood that additional layers and elements can also be incorporated, including but not limited to buffer, nucleation, contact and current spreading layers as well as light extraction layers and elements. It is also understood that the oppositely doped layers can comprise multiple layers and sub-layers, and well as supper lattice structures and inter layers. The active region can comprise single quantum well (SQW), multiple quantum well (MQW), double heterostructure or super lattice structures. The order of the layers can be different and in the embodiment shown, the first or bottom epitaxial layer can be an n-type doped layer and the second or top epitaxial layer can be a p-type doped layer, although in other embodiments the first layer can be p-type doped and the second layer n-type doped. Embodiments where the p-type layer is the bottom layer typically correspond with LEDs that are flip-chip mounted on a submount. In flip-chip embodiments it is understood that the top layer can be the growth substrate, and in different embodiments all or a portion of the growth substrate can be removed. In those embodiments where the growth substrate is removed, the n-type doped layer is exposed as the top surface. In still other embodiments portions of the growth substrate can be left and in some embodiments can be shaped or textured to enhance light extraction.

Each of the LEDs in the chips discussed herein can have first and second contacts, and in the embodiment shown in FIG. 7, the LED has lateral geometry. As such, the LED can be contacted from one side or surface of the LED, instead of top and bottom surfaces as is the case for vertical geometry. The first and second contacts can comprise many different materials such as gold (Au), copper (Cu) nickel (Ni), indium (In), aluminum (Al), silver (Ag), or combinations thereof. Still other embodiments can comprise conducting oxides and transparent conducting oxides such as indium tin oxide, nickel oxide, zinc oxide, cadmium tin oxide, titanium tungsten nickel, indium oxide, tin oxide, magnesium oxide, $ZnGa_2O_4$, $ZnO_2/Sb$, $Ga_2O_3/Sn$, $AgInO_2/Sn$, $In_2O_3/Zn$, $CuAlO_2$, $LaCuOS$, $CuGaO_2$ and $SrCu_2O_2$. The choice of material used can depend on the location of the contacts as well as the desired electrical characteristics such as transparency, junction resistivity and sheet resistance.

Some embodiments of LED chips according to the present invention can have other features, and Group-III nitride based LEDs, for example, can have other features to assist in spreading current from the contacts. This is particularly applicable to spreading current into p-type Group-III nitrides and the current spreading structure can comprise thin semi-transparent current spreading layer covering some or the entire p-type layer. These layers can comprise different materials including but not limited to a metal such as platinum (Pt) or a transparent conductive oxide such as indium tin oxide (ITO).

Submounts can be formed of many different materials such as silicon, ceramic, alumina, aluminum nitride, silicon carbide, sapphire, or a polymeric material such as polymide and polyester etc. In other embodiments the submount can include a highly reflective material, such as reflective ceramics, dielectrics or metal reflectors like silver, to enhance light extraction from the component. In other embodiments the submount can comprise a printed circuit board (PCB), or any other suitable material, such as T-Clad thermal clad insulated substrate material, available from The Bergquist Company of Chanhassen, Minn. For PCB embodiments different PCB types can be used such as standard FR-4 metal core PCB, or any other type of printed circuit board.

In LED chip 100, the barrier layer 106 does not wrap around the edges of the mirror 104 as it does in the prior art. Instead, the barrier layer 106 is patterned smaller than the mirror 104 such that it is not exposed to the light emitted toward the mirror or trapped inside the GaN region 102. In some embodiment, most of the barrier 106 may be removed in at least one embodiment so long as the insulator 108 fulfills the duties of the barrier 106. The areas of the mirror 104 no longer bordered by the barrier 106 are instead surrounded by insulator 108, with the insulator being crucial for preventing Ag migration from the mirror 104. As such, the insulator 108 preferably has high density, high bond strength, low moisture permeability, and high resistance to metal ion diffusion. Additionally, the interface between the insulator 108 and the GaN region 102 is critical, as a weak interface can lead to Ag migration despite having an insulator 108 of high quality. Moreover, the insulator 108 may be optically transparent, and helps space the reflective metal layer 110 from the mirror 104.

Below the insulator 108, a reflective metal layer 110 may also be disposed such that it forms a composite barrier with the insulator and preferably has significantly higher reflectivity than the metal barrier 106. Any light incident on the composite barrier at high angles may experience total internal reflection at the GaN/insulator interface due to the refractive index difference, while low angle light may get reflected off the bottom reflective layer 110. The reflective layer 110 preferably consists of a high reflectivity metal such as Al or Ag, although it is understood that other suitable materials may also be used. The reflectivity of the composite barrier may be greater than 80%, or alternatively may be greater than 90%.

The insulator 108 may have low optical absorption and a low refractive index in order for the composite barrier to be highly reflective. Since the optical and reliability requirements of the insulator 108 may be at odds with one another, the insulator may comprise two or more distinct layers (not shown). For example, the insulator 108 may comprise a thin layer having properties optimized to prevent Ag migration in places where it is in contact with the mirror 104 and the GaN region 102, and the insulator 108 may comprise a second, thicker layer having a low index of refraction in between the reflective metal 110 and the thin layer. As such, total internal reflection can occur at the interface between the thin and thick insulator layers, provided the thicker layer is at least a few optical wavelengths thick. A suitable thickness for the thick insulator layer may be between 0.5-1 μm. In another example, the insulator 108 may comprise three distinct layers, such as the first two as discussed above and a third layer in between the thick layer and the reflective metal layer 110, with the third layer being optimized for good adhesion to the reflective metal layer 110. In yet a further example, a composite barrier may comprise more than three insulator layers, in which reflectivity of the composite barrier is further increased by alternating high and low refractive index insulator materials.

The insulator 108 may be comprised of many different suitable materials, including an oxide, nitride, or oxynitride of elements Si or Al. In insulators comprising two layers as discussed above, the first layer may be comprised of an oxide or oxynitride of Ti or Ta, while the second, thicker layer may be comprised of a low refractive index material such as $SiO_2$. In insulators comprising three layers, the materials may be the same as a two-layer insulator, with the third layer adjacent the reflective metal layer 110 comprised of SiN. While these materials fit the requirements for single or multiple layer insulators as discussed above, it is understood that other suitable materials may also be used and contemplated in the context of the present invention.

FIG. 8 depicts another embodiment of a LED chip 120 according to the present invention. The chip 120 may comprise all the components as discussed with chip 100. Also, as described with chip 100, LED chip 120 comprises a GaN region 122, an Ag-based mirror 124, a metal barrier 126, an insulator 128, and a reflective metal layer 130. However, FIG. 8 further depicts a p-contact being connected to a location outside the junction through a via connection 132. As indicated above, the mirror 124 may also serve as the p-contact for the LED. For purposes of connecting the p-contact to a location outside the junction, the metal barrier 126 may go outside the periphery of the mirror 124 and the GaN region 122 junction. This section can then be coupled to the via connection 132, so that an electrical signal applied to the mirror 124 conducts through the via 132 to the extending portion (illustrated by the crosshatched portion 127 of the barrier 126) and to the GaN region. If the section of the metal barrier 126 extending outside the periphery of the mirror 124 is sufficiently small and narrow compared to the overall length of the mirror's periphery, then the poor reflectivity of the barrier 126 will have a negligible impact on light extraction. In one embodiment, the width of the barrier 126 portion 127 outside the mirror 124 periphery is ~20 μm or less.

FIG. 9 depicts another embodiment of a LED chip 140 according to the present invention, with chip 140 being a multi-junction chip. Providing such a multi-junction chip is one way to get an array of LEDs having high output on higher voltages. The chip 140 may comprise all the components as discussed with chip 100. Also, as described with chip 100, LED chip 140 comprises GaN regions 142, Ag-based mirrors 144, metal barriers 146, an insulator 148, and a reflective metal layer 150. However, FIG. 9 further depicts a p-contact being connected to the n-contact 154 of an adjacent junction.

As indicated above, the mirror 144 may also serve as the p-contact for the LED. For purposes of connecting the p-contact to the n-contact 154 of an adjacent junction, the metal barrier 146 may go outside the periphery of the mirror 144 and the GaN region 142 junction. If the section 147 of the metal barrier 146 extending outside the periphery of the mirror 144 is sufficiently small and narrow compared to the overall length of the mirror's periphery, then the poor reflectivity of the barrier 146 will have a negligible impact on light extraction. Furthermore, the portion 147 of the metal barrier 146 may also be used to form a wire bond for connecting the p-contact to a package terminal. It is also noted that the metal barrier 146 does not have to cover a majority of the underside of the mirror 144 as depicted in the figures. In some embodiments, the mirror 144 may be substantially eliminated, and can be in contact with the mirror 144 in only a small section sufficient to form a good electrical contact.

LED chip 140 further comprises passivation layers 152, with the characteristics of passivation layers well known in the art. The passivation layers 152 may be comprised of SiN, which is a suitable material for providing moisture resistance to the chip. However, it is understood that other appropriate materials may be used, such as $SiO_2$. $SiO_2$ is not as moisture resistant as SiN.

Figure 6:
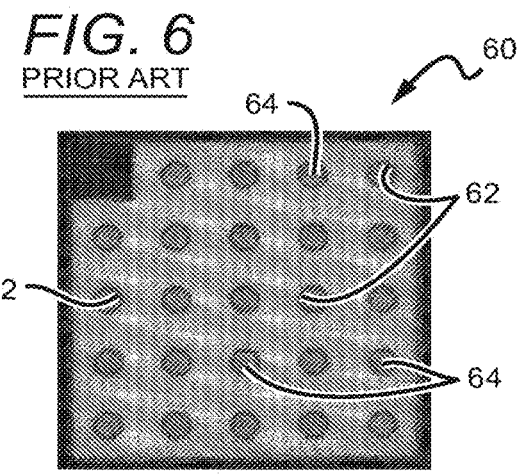
FIG. 6 is a top view of a prior art monolithic LED chip according to the present invention.
Figure 10:
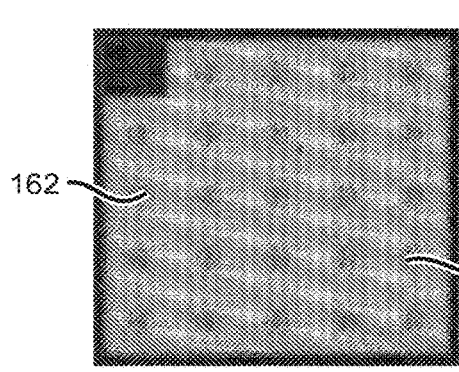
FIG. 10 is a top view of a monolithic LED chip according to the present invention.

FIG. 10 depicts a monolithic LED chip comprising a plurality of LEDs and a plurality of contact vias 162 as is discussed in more detail below with respect to FIG. 12. When compared to FIG. 6, it can be readily observed that the dark circles in FIG. 6 caused by the exposed portion of barrier layers 64 have been virtually eliminated in FIG. 10. This is because the barrier layers in FIG. 10 (not viewable from this perspective), have been made smaller than the mirror layers, and are thus not exposed and/or are minimally exposed at the periphery of said mirrors. Due to the reduction of the exposed barrier layers, any dimming effects of the barrier layers are substantially reduced and/or eliminated.

Figure 11:
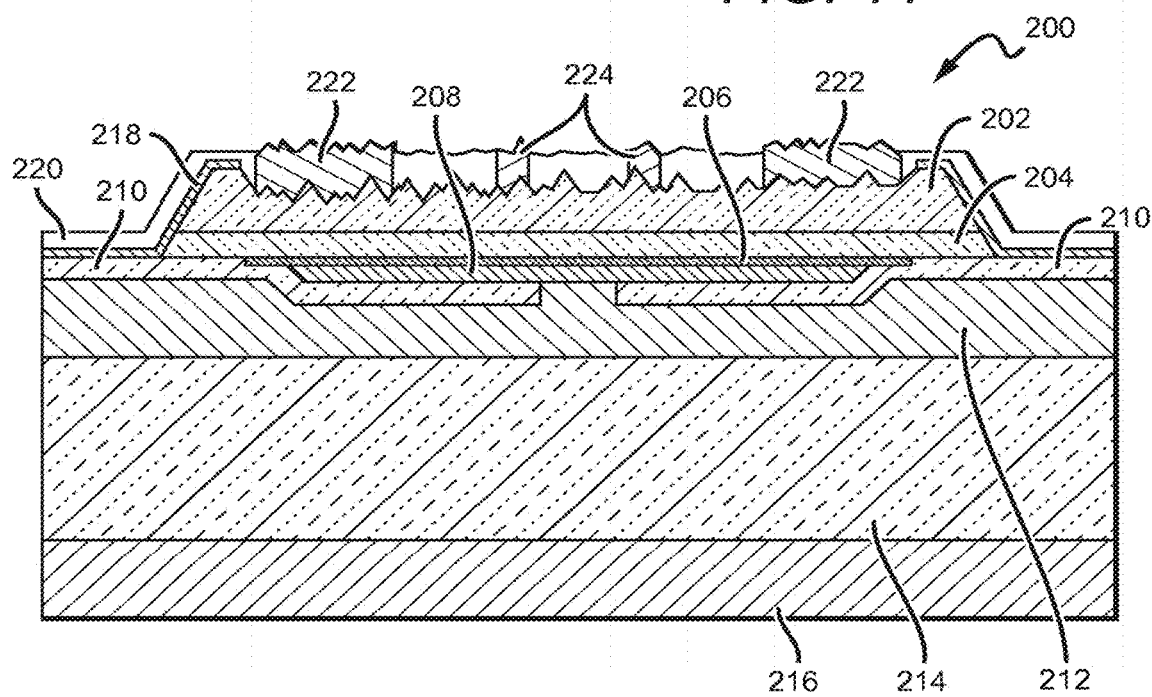
FIG. 11 is a sectional view of another embodiment of an LED chip according to the present invention.

FIG. 11 depicts another embodiment of a LED chip 200 according to the present invention. The chip 200 may comprise all the components as discussed with chip 100. FIG. 11 may further include a roughened n-GaN layer 202, a p-GaN layer 204, a mirror layer 206 (which may also serve as the p-contact for the LED), a barrier layer 208, a dielectric barrier layer 210, a bond metal layer 212, a carrier layer 214, a AuSn layer 216, passivation layers 218, 220 (with layer 220 at least partially roughened), and n-contacts 222, 224 on the roughened GaN layer. As discussed above, the roughened layers help with light extraction.

As illustrated, the barrier layer 208 in FIG. 11 is sized smaller than the mirror 206. As discussed above, such sizing of the barrier layer helps eliminate many of the light-absorbing effects inherent in layer 208, which in turn improves the overall emission and efficiency of the LED chip 200. In this embodiment (as well as in others), the characteristics of barrier layer 208 may allow it to act as a current spreading layer as well as a barrier for Ag migration and/or a protective layer for mirror 206, such that bond metal layer 212 is isolated from mirror 206 and thus does not dissolve into mirror 206. Bond metal layer 212 may be at least partially comprised of tin, which may otherwise dissolve into the mirror 206 but for the barrier 208. Bond metal layer 212 may further be reflective, although it may not be as highly reflective as mirror 206.

Passivation layers 218 are disposed on the sidewalls of the active region, providing sidewall passivation as is well known in the art. Passivation layers 218 may be comprised of SiN, which exhibits favorable moisture resistive characteristics. However, it is understood that other suitable materials are also contemplated. Passivation layer 220 may also be disposed over the device as shown to provide physical protection to the underlying components. Passivation layer 220 may be comprised of $SiO_2$, but it is understood that other suitable passivation materials are also contemplated.

The dielectric barrier layer 210 is provided, at least in part, to protect/isolate the mirror 206 and portions of barrier 208 from the bond metal layer 212. The dielectric layer may be transparent, and/or may comprise different dielectric materials such as SiN, $SiO_2$, Si, Ge, MgOx, MgNx, ZnO, SiNx, SiOx, alloys or combinations thereof. The dielectric layer 210 may also extend further under barrier 208 as depicted by the crosshatched sections under barrier 208.

FIG. 12 depicts another embodiment of a LED chip 230 according to the present invention. The chip 230 may comprise some or all of the components as discussed with the other chip embodiments. However, the biggest difference between chip 230 and the other chip embodiments is that n-contact vias are provided as shown in FIG. 12, with the vias not shown in FIG. 13 for ease of illustration. The vias allow for the removal of the re-contact metal on the topside of the device and the re-contact is essentially embedded within the device and electrically accessibly from the bottom of the chip. With less topside metal to block light emission, improved brightness can be realized. Furthermore, the barrier metal outside the periphery of the mirror is eliminated and/or substantially reduced, which further contributes to the emission efficiency of the device.

The vias according to the present invention can be formed using conventional methods, such as etching to form the openings for the vias and photolithographic processes for forming the via. The vias take only a fraction of the area on the LED chip that would be needed for a wire bond pad. By using one or more vias in place of a wire bond pad, less of the active area is removed and less emission blocking metal for contacts is located on the topside of the device. This leaves more LED active area for light emission, thereby increasing the overall efficiency of the LED chip.

It is also understood that different embodiments can have more than one via and the vias can be in many different locations. In those embodiments having multiple vias, the vias can have different shapes and sizes and can extend to different depths in the LED. It is also understood that different embodiments can also comprise vias used in place of the first wire bond pad.

FIG. 12 may further include a roughened n-GaN layer 232, p-GaN layers 234, mirror layers 236 (which may also serve as the p-contact for the LED), barrier layers 238, passivation layers 240, 241, an n-contact 242, barrier layer 244, a bond metal layer 246, a carrier layer 248, AuSn layer 250, and passivation layer 252. As discussed above, the roughened layers assist with improved light extraction of the device.

As with other embodiments discussed herein, the barrier layers 238 are sized such that they are smaller than the mirror layers 236 and/or are prevented from extending beyond 40% or more of the periphery of the mirrors 236. The barrier layers 238 may be further provided to form a contact at the topside of the device for the p-contact integral to at least a portion of mirrors 236. As best shown in Furthermore, the barrier layers 238 may help spread current laterally through the device since the mirrors 236 may be too thin to effectively spread current.

The barrier layer 244 may be provided as a protective layer for n-contact 242, such that bond metal layer 246 is isolated from n-contact 242 and thus does not dissolve into or otherwise adversely react with n-contact 242. Barrier layer 244 may be comprised of TiW/Pt, although it is understood that other suitable materials are contemplated. In some embodiments, barrier layer 244 may not be necessary depending on the material make-up of the n-contact 242 and bond metal layer 246. The n-contact may be comprised of a variety of suitable materials, with preferred materials being reflective to further enhance the light emission of the device. As such, n-contact 242 may be comprised of Al, Ag, or other reflective materials. Bond metal layer 246 may further be reflective.

Passivation layers 241 are disposed on the sidewalls of the active region, providing sidewall passivation as is well known in the art. Passivation layers 240, 241 may be comprised of SiN, which exhibits favorable moisture resistive characteristics. However, it is understood that other suitable materials are also contemplated. Passivation layer 252 may also be disposed over the device as shown to provide physical protection to the underlying components. Passivation layer 252 may be comprised of $SiO_2$, but it is understood that other suitable passivation materials are also contemplated.

Figure 13:
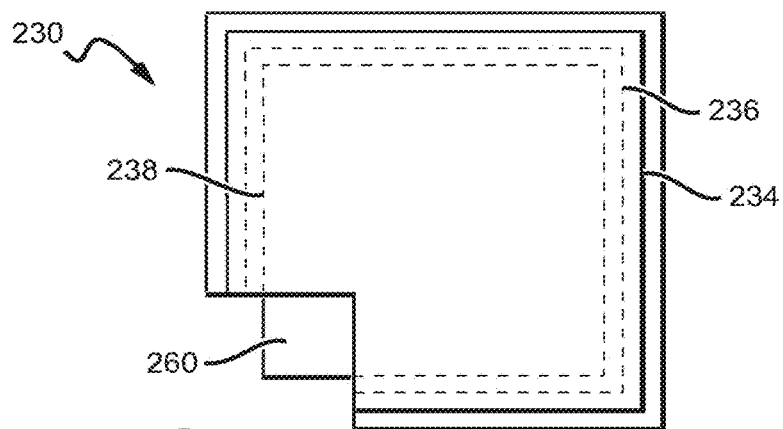
FIG. 13 is a top view of one embodiment of an LED chip according to the present invention.

FIG. 13 is a top view of the LED chip 230 shown in FIG. 12, with FIG. 13 showing the n-type layer 234 and the outer edge of the mirror 236 below the n-type layer and in phantom. FIG. 13 also shows the outer edges of the barrier layer 238 with the areas not exposed shown in phantom as further described below. The remaining layers, vias and inner edges of the barrier layer and mirror layers are not shown for ease of illustration. As mentioned above a portion of the barrier layer 238 may serve as the p-type contact at the topside of the device. In some embodiments a portion of the barrier layer can be exposed for contacting and in the embodiment shown the LED chip layers can be removed above a portion of the barrier layer. In one embodiment the layers above the barrier layer 238 can be etched to the barrier layer 238, thereby forming an exposed barrier layer region 260. The exposed region 260 can be in many different locations and can have many different shapes, with the embodiment shown being at a corner of the LED chip 230.

Exposing the barrier layer in this manner provides advantages such as ease of contacting, but can also present the danger of moisture or contaminants entering the LED layers along the surfaces or edges in the exposed region 260. This moisture or contaminants can negatively impact the lifetime and reliability of an LED chip. To help reduce this danger, steps or transitions can be included as part of the barrier layer that can inhibit or eliminate the amount of moisture or contaminants that can enter the LED chip. The steps or transition can take many different shapes and sizes. Different LED chips can have different numbers of steps or transitions and they can be included in different locations on the barrier layer. In still other embodiments, steps or transitions can be included in other layers.

FIG. 14 shows another embodiment of an LED chip 270 that is similar to the LED chip 230 shown in FIGS. 12 and 13. The LED chip 270 has an n-type layer 234, mirror layer 236 and barrier layer 272, with the other layers and features not shown for ease of illustration. N-type layer 234 and mirror layer 236 are similar to those in LED chip 230 as shown in FIG. 13. Barrier layer 272 is also similar to barrier layer 236 in FIG. 13 and can be contacted through the exposed region 274. The barrier layer 272 has two steps 276 along the edge of the barrier layer 272 that help reduce or eliminate moisture or contaminants that can enter the LED chip 270 along the edge of the barrier layer 272.

For the embodiments shown in both FIGS. 13 and 14 the exposed area of the barrier layer results in a portion of the barrier layer being uncovered such that it may absorb some LED chip light. The amount of exposed barrier can be minimized to minimize the impact of the light absorption, with the periphery of the mirror being free of the barrier layer in the percentages described above. In some embodiments, the exposed portion of the barrier layer can be less that 20% of the overall barrier layer surface. In still other embodiments it can be less than 10%, while in other embodiments it can be less than 5%.

The barrier layer can have many different shapes and can be arranged in different locations relative to the other layers of the LED chips according to the present invention. FIG. 15 shows another embodiment of an LED chip 280 according to the present invention that is similar to the LED chip 270, and shows an n-type layer 234 and mirror layer 236. In this embodiment, however, the barrier layer 282 extends beyond that mirror layer 236 along two edges of the mirror layer 236, and the barrier layer can extend beyond the mirror layers in different locations of LED chips. To still have the desirable emission efficiency of the LED chips, the exposed portions of the barrier layers can be relatively thin to reduce the light absorbing surfaces. In some embodiments more than 75% of the exposed edges can be less than 3 microns wide. In other embodiments 90% can have this width, while in other embodiments 100% of the exposed edges can have this width. The exposed width for these percentages can also be different in other embodiments, such as less than 4 microns or less than 2 microns.

The present invention can be used in many different lighting applications, and in particular those using a small sized high output light source. Some of these include, but are not limited to, general illumination, outdoor lighting, flashlights, white LEDs, street lights, architectural lights, home and office lighting, display lighting and backlighting.

Different embodiments of LED chips can be arranged in many different ways and can be used in many different applications according to the present invention. Some of these LED chips can comprise one or more active regions that can be interconnected in different ways, with some embodiments comprising a plurality of active regions on the same submount and interconnected to form high luminous flux emitters operating from relatively high voltages. In some embodiments, the active regions can be coupled together in a linear fashion to provide a light source similar to a filament source. By providing the active regions on a single submount, the space between adjacent LEDs can be minimized. When the active regions emit during operation, the dark spaces between adjacent ones of the active regions can be minimized to give the source the appearance of continual light source.

In some embodiments, the active regions can be formed as a wafer and then mounted (e.g. flip-chip mounted) on the submount. The submount can comprise internal electrical interconnects and insulation layers to allow for serial interconnection of LEDs without the need for external interconnects such as wire bonds. In other embodiments, the wafer with the active regions can comprise internal interconnections and/or insulation layers for interconnection.

In embodiments where the active regions are mounted on the submount in wafer form, the spaces or streets can be formed in the wafer to form the individual active regions. The active region and submount combination can be further processed by dividing or dicing the desired number of active regions. For example, an active region and submount combination with four linearly arranged active regions could be separated from the wafer active region and submount combination. Contacts can then be formed on the LED chip for applying an electrical signal to the LED chip during operation.

In still other embodiments, the desired group of active regions can be separated from the active region wafer and then mounted on the submount. For example, a linear arrangement of four active regions can be separated from the active region wafer and then mounted (e.g. flip-chip mounted) to a submount appropriately sized and arranged to accept the four active regions. In still other embodiments, individual active regions can be mounted on submount.

The monolithic LED chips are described herein with reference to series connections, but it is understood that the active regions can be interconnected in different series and parallel combinations. The different embodiments of the present invention can be arranged in many different ways with many different features. Some embodiments can comprise barrier layers as described above, with the barrier layer in some embodiments not extending, or minimally extending, beyond the edge of the mirror as described above in certain areas (e.g. below the emission area of the active region). This can help minimize the amount of light absorbed by the barrier layer, thereby increasing overall emission efficiency.

FIG. 16 is a sectional view of one embodiment of a monolithic LED chip 300 according to the present invention. The LED chip 300 can comprise many different features and layers, most of which are not shown for ease of description. The LED chip 300 comprises a plurality of emitting active regions 302 mounted on submount 304. As mentioned above, in some embodiments the active regions can be mounted on the submount in wafer form or portion of the wafer comprising a group of active regions. In still other embodiments, individual active regions can be mounted to the submount 304. In embodiments where an active region wafer or portion of an active region wafer is mounted to the submount 304, the individual active regions can be separated on the submount 304 by known methods such as etching, cutting or dicing. The side surfaces of the resulting active regions can be angled or shaped, and the distance between adjacent active regions is relatively small. In some embodiments, the distance can be 15 microns (μ) or less or less, while in other embodiments it can be 10μ or less. In still other embodiments, it can be 5μ or less, and in other embodiment is can be 1μ or less. Some embodiments can also have a space in the range of 1 to 0.05μ. The space can have different percentage of a width of the active regions with some embodiments having a space that is approximately 15% or less of an active region width, while in other embodiments the space can be approximately 10% or less. In still other embodiments the space can be 5% or less of a width, while other embodiments can have a space that is 2.5% or less of a width. Other embodiments can have a space that is 1.5% or less of a width, with some embodiments having a space that is approximately 1.1% of an active region width. These are only some of the ratios and dimensions that can be used in different embodiments according to the present invention.

The submount 304 can also contain integral and internal electrical interconnects 306 arranged to connect the active regions in series. In some embodiments this can comprise a number of vias and electrically conductive paths or layers coupled together in different ways to provide the desired interconnect scheme. The LED chip 300 can also comprise first and second contact pads 308, 310 for applying an electrical signal to the LED chip 300. The first contact 308 can be either a p-contact or an re-contact, with the second contact 310 being the other of the p-contact and n-contact. In some embodiments, the LED chip 300 also comprise contact interconnects 312 for conducting an electrical signal from the first contact pad 308 to the first of the active regions 302, and for conducting an electrical signal from the last of the active regions 302 to the second contact pad 310.

The arrangement allows for an electrical signal to be applied to the LED chip 300 across the first and second contacts 308, 310. The LED chip 300 can also comprise one or more insulating layers 314 to electrically insulate the active regions 302 and interconnects 306, 312 from any conductive elements below the insulating layer 314. In some embodiments, other insulating layers can be included such that at least a portion of the interconnects 306, 312 are surrounded by insulating materials, with those portions buried in the insulating material. The LED chip 300 can also comprise a substrate 316 and bonding layer 318 for adhesion between the substrate 316 and the layers above the substrate 316.

The LED chip 300 can operate from an electrical signal that is approximately equal to the sum of the junction voltages of the active regions 302. Other factors contribute to the operating voltage, with the voltage generally scaling with the number of junctions. In some embodiments each of the active regions 302 can have a junction voltage of approximately 3V, such that the electrical signal applied to the active regions can be approximately equal to 3 times the number of active regions. In some embodiments, the LED chip can have four active regions so that the LED chip operates from an electrical signal of approximately 12V.

The LED chips according to the present invention can be fabricated in many different ways according to the present invention. FIG. 17 shows the LED chip 300 at an intermediate manufacturing step where in some embodiments the active regions can be formed separately from the submount 304, with the submount having buried interconnects 306, 312, insulating layer(s) 314 and contacts 308, 310. The active regions 302 can then be mounted to the submount in contact with interconnects 306, 312. The active regions 302 can then have spaces formed between adjacent ones of the active regions, with the spaces formed either before or after mounting on the submount 304.

Figure 18:
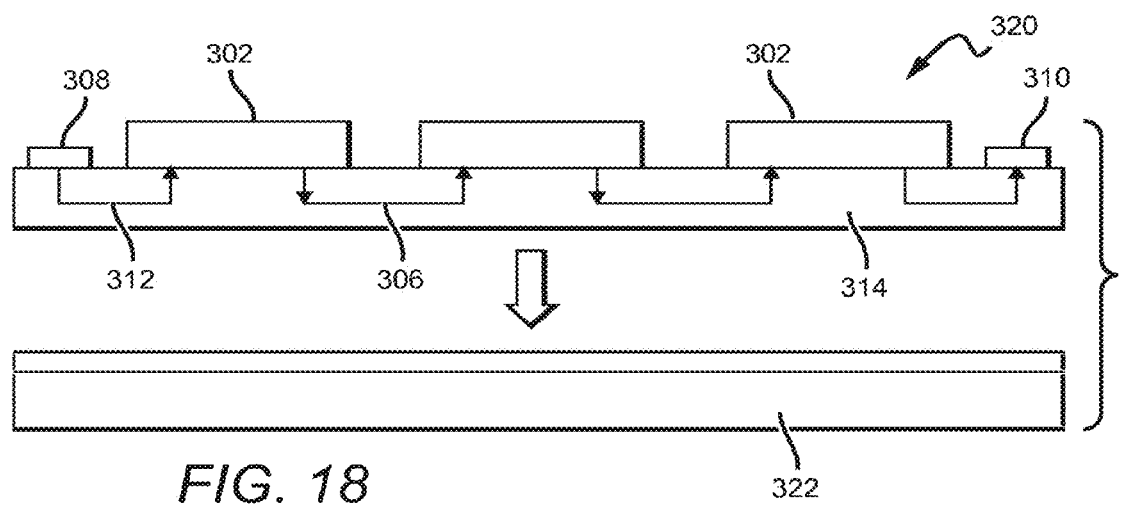
FIG. 18 is a sectional view of another LED chip according to the present invention at an intermediate manufacturing step.
Figure 19:
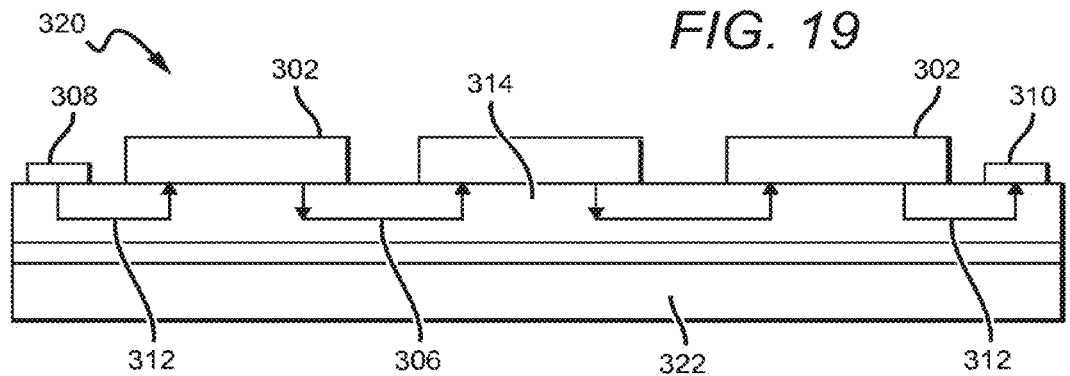
FIG. 19 is another sectional view of the LED chip shown in FIG. 18.

FIGS. 18 and 19 show another embodiment of a monolithic LED chip 320 having many of the same features as LED chip 300. For these same features, the same reference numbers are used with the understanding that the description above applies to the features in this embodiment. In this embodiment, the active regions 302 are formed with interconnects 306, 312, insulating layer(s) 314 and contacts 308, 310. Like the embodiment above, at least a portion of the interconnects 306, 312 are buried in or surrounded by insulating material to electrically isolate them from other features in the LED chip 320. This structure can then mounted to a separate substrate and bonding layer structure 322 to form the monolithic LED chips 320 with serially interconnected active regions.

Figure 20:
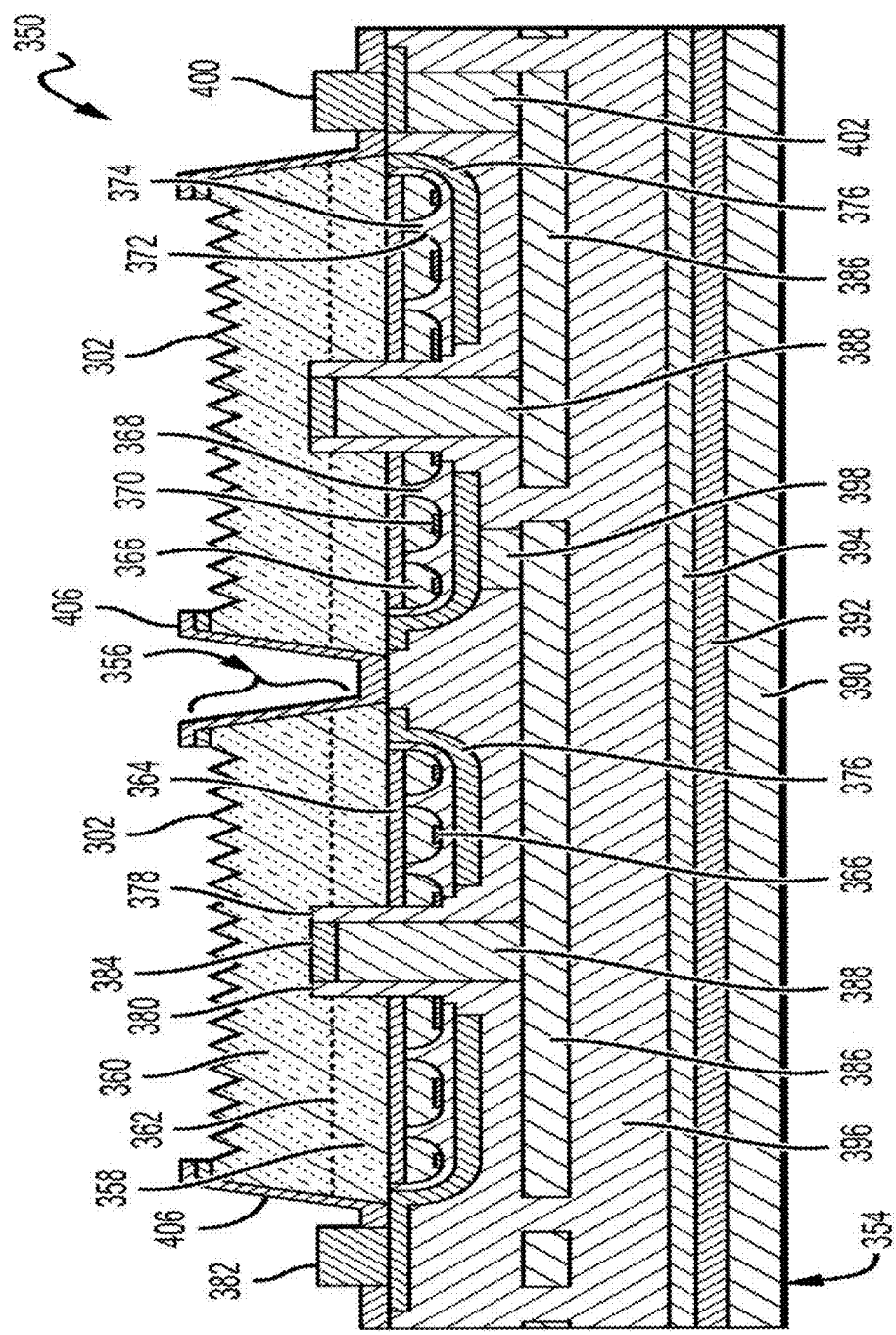
FIG. 20 is a sectional view of another embodiment of a monolithic LED chip according to the present invention.

Different LED chip embodiments according to the present invention can have many different features and layers of different materials arranged in different ways. FIG. 20 shows another embodiment of a monolithic LED chip 350 according to the present invention comprising two interconnected active regions 352, but it understood that other monolithic LED chips can comprise many different numbers of interconnected active regions. The active regions 352 can have lateral geometry and can be flip-chip mounted on a submount 354 that can have many different features and can be made of many different layers and materials.

The active regions 352 can be made from many different material systems, with the embodiment shown being from a Group-III nitride material system. The active regions 352 can comprise a GaN active structure 356 having a p-type layer 358, n-type layer 360 and an active layer 362. Some embodiments of the active regions can also comprise a growth substrate that can be many different materials such as silicon carbide or sapphire, and can be shaped or textured to enhance light extraction such as the substrate shaping utilized in commercially available DA line of LEDs from Cree, Inc. In the embodiment shown, the substrate can be removed and the n-type layer 360 can be shaped or textured to enhance light extraction.

The active regions 352 can also comprises a current spreading layer 364 that is on the p-type layer 358 such that when the active regions 352 are mounted on the submount 354, the LED current spreading layer 364 is between the active structure 356 and the submount 354. The current spreading layer 364 can comprise many different materials and is typically a transparent conductive oxide such as indium tin oxide (ITO) or a metal such as platinum (Pt), although other materials can also be used. The current spreading layer 364 can have many different thicknesses, with the present invention having a thickness small enough to minimize absorption of light from the active structure that passes through the current spreading layer. Some embodiments of the current spreading layer 364 comprise ITO having thicknesses less than 1000 angstroms (Å), while other embodiments can have a thickness less than 700 Å. Still other embodiments can have a thickness less than 500 Å. Still other embodiments can have a thickness in the range of 50 to 300 Å, with some of these embodiments having current spreading layer 364 with a thickness of approximately 200 Å. The current spreading layer 364 as well as the reflective layers described below can be deposited using known methods. It is understood that in embodiments where current spreading is not a concern, the active regions can be provided without a current spreading layer.

A low index of refraction (IR) reflective layer 366 can be arranged on the current spreading layer 364, with current spreading layer 364 between the reflective layer 366 and active structure 356. The reflective layer 366 can comprise many different materials and preferably comprises a material that presents an IR step between the materials comprising the active structure 356. Stated differently, the reflective layer 366 should have an IR that is smaller than the active structure to promote TIR of active structure light emitting toward the reflective layer 366. Light that experiences TIR can be reflected without experiencing absorption or loss, and TIR allows for the efficient reflection of active structure light so that it can contribute to useful or desired active region emission. This type of reflective layer can be an improvement over devices that rely on metal layers to reflect light where the light can experience loss with each reflection. This can reduce the overall LED chip emission efficiency.

Many different materials can be used for the reflective layer 366, with some having an IR less than 2.3, while other embodiments can have an IR less than 2.15. In still other embodiments the IR can be less than 2.0. In some embodiments the reflective layer 366 can comprise a dielectric, with some embodiments comprising $SiO_2$. It is understood that other dielectric materials can be used such as SiN, Si, Ge, MgOx, MgNx, ZnO, SiNx, SiOx, AlN, and alloys or combinations thereof.

Some Group III nitride materials such as GaN can have an IR of approximately 2.4, and $SiO_2$ has an IR of approximately 1.46. Embodiments with an active LED structure 356 comprising GaN and that also comprises a $SiO_2$ reflective layer, can have a sufficient IR step between the two to allow for efficient TIR of light at the junction between the two. The reflective layer 366 can have different thicknesses depending on the type of material, with some embodiments having a thickness of at least 0.2 microns (μm). In some of these embodiments it can have a thickness in the range of 0.2 to 0.7 μm, while in some of these embodiments it can be approximately 0.5 μm thick.

As light experiences TIR at the junction with the reflective layer 366 an evanescent wave with exponentially decaying intensity can extend into the reflective layer 366. This wave is most intense within approximately one third of the light wavelength from the junction (about 0.3 um for 450 nm light in SiO2). If the reflective layer 366 is too thin, such that significant intensity remains in the evanescent wave at the interface between the first reflective layer 366 and the second reflective layer 368, a portion of the light can reach the second reflective layer 368. This in turn can reduce the TIR reflection at the first interface. For this reason, in some embodiments the reflective layer 366 should have a thickness of at least 0.3 um.

A metal reflective layer (i.e. second reflective layer) 368 and adhesion layer 370 are included on the reflective layer 366, with the adhesion layer 370 sandwiched between and providing adhesion between the metal layer 368 and reflective layer 366. The metal layer 368 is arranged to reflect light that does not experience TIR at the junction with the reflective layer 366 and passes through the reflective layer 366. The metal layer 368 can comprise many different materials such as Ag, Au, Al, or combinations thereof, with the present invention being Ag.

Many different materials can be used for the adhesion layer 370, such as ITO, TiO, TiON, $TiO_2$, TaO, TaON, $Ta_2O_5$, AlO or combinations thereof, with a preferred material being TiON. The adhesion layer 370 can have many different thicknesses from just a few Å to thousands of Å. In some embodiments it can be less than 100 Å, while in other embodiments it can be less than 50 Å. In some of these embodiments it can be approximately 20 Å thick. The thickness of the adhesion layer 370 and the material used should minimize the absorption of light passing to minimize losses of light reflecting off the metal layer 368.

The active regions 352 can further comprise reflective layer holes 372 that can pass through the adhesion layer 370 and the reflective layer 366, to the current spreading layer 364. The holes 372 can then be filled when the metal layer 368 is deposited with the metal layer material forming vias 374 to the current spreading layer 364. The vias 374 can provide a conductive path through the reflective layer 368, between the p-contact and the current spreading layer 364.

The holes 372 can be formed using many known processes such as conventional etching processes or mechanical processes such as micro drilling. The holes 372 can have many different shapes and sizes, with the holes 372 in the embodiment shown having angled or curved side surfaces and a circular cross-section with a diameter of less than 20 µm. In some embodiments, the holes 372 can have a diameter of approximately 8 µm, with others having a diameter down to 1 µm. Adjacent holes 372 can be less than 100 µm apart, with the embodiment shown having a spacing of 30 µm spacing from edge to edge. In still other embodiments, the holes can have a spacing of as low as 10 µm or less. It is understood that the holes 372 (and resulting vias) can have cross-section with different shapes such as square, rectangular, oval, hexagon, pentagon, etc. In other embodiments the holes are not uniform size and shapes and there can be different or non-uniform spaces between adjacent holes.

In other embodiments different structures can be used to provide a conductive path between the p-contact and the current spreading layer. Instead of holes an interconnected grid can be formed through the reflective layer 368, with a conductive material then being deposited in the grid to form the conductive path through the composite layer. The grid can take many different forms, with portions of the grid interconnecting at different angles in different embodiments. An electrical signal applied to the grid can spread throughout and along the interconnected portions. It is further understood that in different embodiments a grid can be used in combination with holes, while other embodiments can provide other conductive paths. In some embodiments one or more conductive paths can run outside the LED chip's active layer such as along a side surface of the LED chip.

The active regions 352 can also comprise a barrier layer 376 on the metal layer 368 to prevent migration of the metal layer material to other layers. Preventing this migration helps the LED chips 352 maintain efficient operation through their lifetime.

An active structure hole 378 can be included passing through the barrier layer 376, metal layer 368, adhesion layer 370, reflective layer 366, and p-type layer 358, to expose the n-type layer 360. A passivation layer 380 is included on the barrier layer 376 and the side surfaces of the active structure hole 378. The passivation layer 380 protects and provides electrical insulation between the contacts and the layers below as described in more detail below. The passivation layer 380 can comprise many different materials, such as a dielectric material. In the embodiment shown, the barrier layer 376 does not extend beyond the edge of the metal layer 368 around the active structure hole 378. This reduces the amount of light absorbing barrier layer material that would absorb LED light, thereby increasing the overall emission efficiency of the LED chip 350.

For one of the active regions 352, the barrier layer 376 can extend beyond the edge of the active region 352 and can be exposed at a mesa on the passivation layer 380 adjacent the LED. This exposed portion can be used for contacting the serially interconnected active regions 352. In some embodiments, a p-contact pad 382 can be deposited on the passivation barrier layer 376, with the p-contact 382 providing an electrical signal that can pass to the p-type layer 358. An electrical signal applied to the p-contact passes through the barrier layer 376, the metal layer 368, the vias 374, and to the current spreading layer 364 through which it is spread to the p-type layer 358.

An n-contact 384 can be formed on the n-type layer 360 and a conductive n-type layer vias 388 can be formed through the passivation layer 380 and between the n-type contact 384 and an interconnection metal layer 386. As more fully described below, the interconnection metal layer 386 is arranged to conduct an electrical signal between adjacent ones of the LED chips 352 to interconnect them in series. The interconnection metal layer 386 can have breaks along its length to facilitate this serial interconnection and can be made of many electrically conductive materials, such as those described herein. As described above, the metal layer 386 can be formed as part of the submount 354 using known methods, are can be formed with the active regions. An electrical signal at the n-type layer 360 conducts into the n-contact 384, into its corresponding via 388, and to the interconnection metal layer 386. The interconnection layer can have many different shapes and thicknesses. In some embodiments it can comprise a substantially continuous layer with breaks, while in other embodiment it can comprise conductive traces.

The p-contact 382, the n-contact 384, interconnection metal layer 386, and n-type vias 388 can comprise many different materials such as Au, copper (Cu) nickel (Ni), indium (In), aluminum (Al), silver (Ag), tin (Sn), platinum (Pt) or combinations thereof. In still other embodiments they can comprise conducting oxides and transparent conducting oxides such as ITO, nickel oxide, zinc oxide, cadmium tin oxide, indium oxide, tin oxide, magnesium oxide, $ZnGa_2O_4$, $ZnO_2/Sb$, $Ga_2O_3/Sn$, $AgInO_2/Sn$, $In_2O_3/Zn$, $CuAlO_2$, $LaCuOS$, $CuGaO_2$ and $SrCu_2O_2$. The choice of material used can depend on the location of these features as well as the desired electrical characteristics such as transparency, junction resistivity and sheet resistance.

As mentioned above, the growth substrate for active regions 352 has been removed, and the top surface of the n-type layer is textured for light extraction. The active regions 352 are flip-chip mounted to a substrate 390 that can provide mechanical stability. A bond metal layer 392 and blanket mirror 394 between the substrate 390 and the active structure 356. The substrate 390 can be made of many different materials, with a suitable material being silicon. The blanket mirror 384 can be made of many different materials, with a suitable material being Al. The blanket mirror 384 helps to reflect LED light that escapes reflection by the reflective layer 366 and the metal layer 368, such as light that passes through the active structure hole 378.

The reflective layer 366 and the metal layer 368 are arranged between the active region's active structure 356 and the substrate 390 so that light emitted by the active structure 356 toward the substrate 390 can be reflected back to contribute to useful LED light emission. This reduces the amount of light that can be absorbed by structures such as the substrate 390, with the embodiments according to present invention promoting reflection by TIR instead of reflection off metal layers, to further reduce light loss due to absorption.

The submount 354 also comprises a isolation layer 396 arranged on the blanket mirror 394 such that it provides electrical isolation between the blanket mirror 394 and all elements above the blanket mirror 394, such as the interconnection metal 386. This isolation allows for electrical signals to be conducted between adjacent ones of the active regions without being shorted to the blanket mirror 394 or other features below the blanket mirror 394. The isolation layer 396 can be made of many different materials, with the preferred material being made of an electrically insulating material such as a dielectric. The combination of the isolation layer 396 and passivation layer 380 results in the interconnection metal 386 being buried and/or surrounded by electrically insulating materials. This internal isolation of the electrical paths within the LED chip 350 provides for reliable and efficient interconnection and operation of the active regions 352.

As mentioned above, an electrical signal is applied to the p-type layer 358 in the first of the active regions connected in series, at the p-type contact pad 382. For each of the subsequent active regions 352 connected in series, a p-type conductive vias 398 is included between the interconnection metal layer 386 and the barrier layer 376 of the active region. The electrical signal at the vias 398 passes through the barrier layer 376 and to the current spreading layer 364 and to the p-type layer 358.

At the last of the serial connected actives regions, and n-contact pad 400 is formed on a mesa on the passivation layer 380 adjacent the active region 352. An n-pad via 402 is formed between the n-contact pad 400 and the interconnection metal layer to conduct a signal from the n-type layer 360 in the last of the LED chips 352 to the re-contact pad 400. The emitter 350 can also comprise a passivation or protection layer 406 on the side surfaces of the active structure 356 and covering the top surface of the submount 354 around the p-contact pad 382 and the re-contact pad 400.

Figure 21:
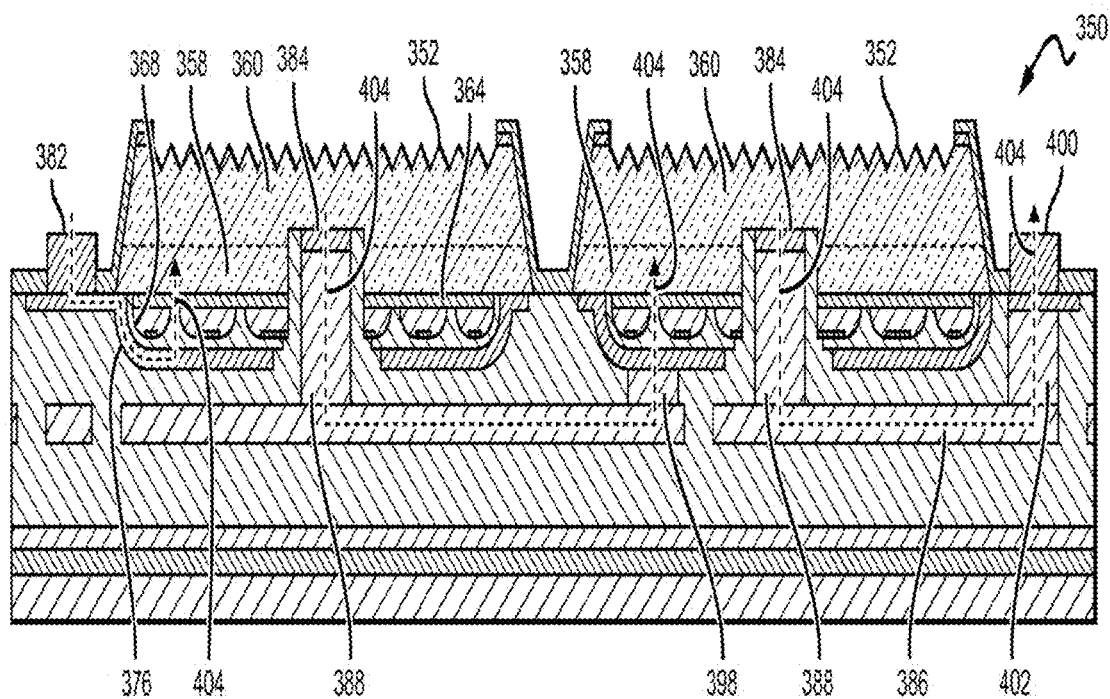
FIG. 21 is a sectional view of the LED chip in FIG. 20 showing flow of an electrical signal.

FIG. 21 shows the LED chip 350 during operation with an electrical signal following a path through the emitter 350 as shown by arrows 404. An electrical signal is applied to the p-contact pad 382 and is conducted through the barrier layer 376, metal layer 368, and current spreading layer 364, to the p-type layer 358. The signal then passes through to the n-type layer 360 where it passes through to the n-contact 384 and the n-type vias 388. The signal then conducts along the interconnection metal layer where it passes into the first of the p-type vias 398. The signal is then conducted to the p-type layer 358 in the second active region 352, where it passes into the n-type layer 360, re-contact 384 and n-type vias 388. Although only two active regions 352 are shown, it is understood that emitters according to the present invention can have many more, and in those embodiments, the signal then passes on to the next of the active regions 352 connected in series and this continues until the last of the active regions 352. At the last of the active regions 352, the electrical signal at the n-type vias 388 passes into the interconnection metal layer 386 and to the n-pad vias 402, where it is conducted to the n-contact pad 400. This type of interconnection and current flow allows for a high voltage LED chip light source formed monolithically on a submount.

Figure 22:
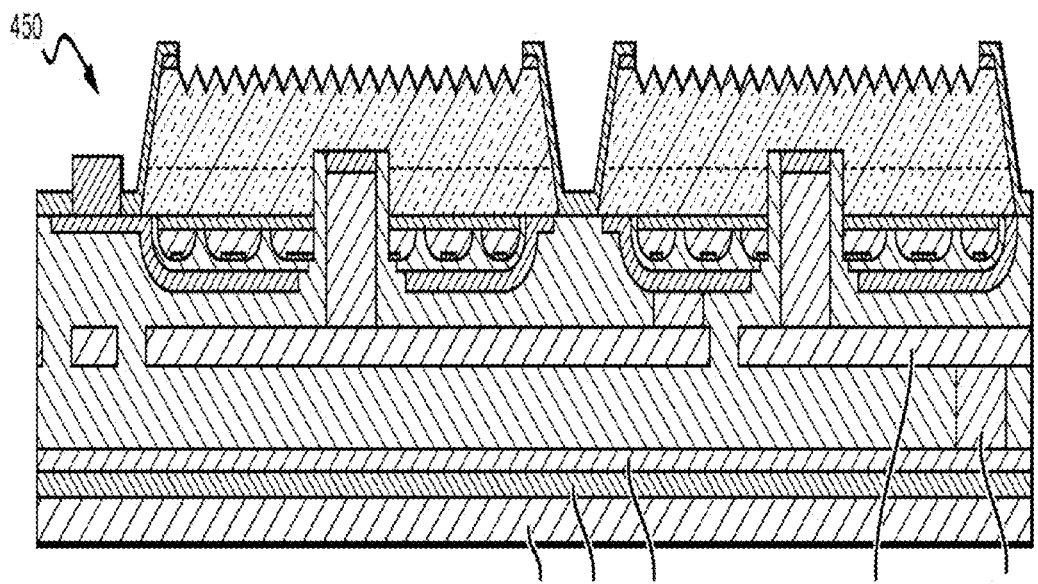
FIG. 22 is a sectional view of another embodiment of a monolithic LED chip according to the present invention.
Figure 23:
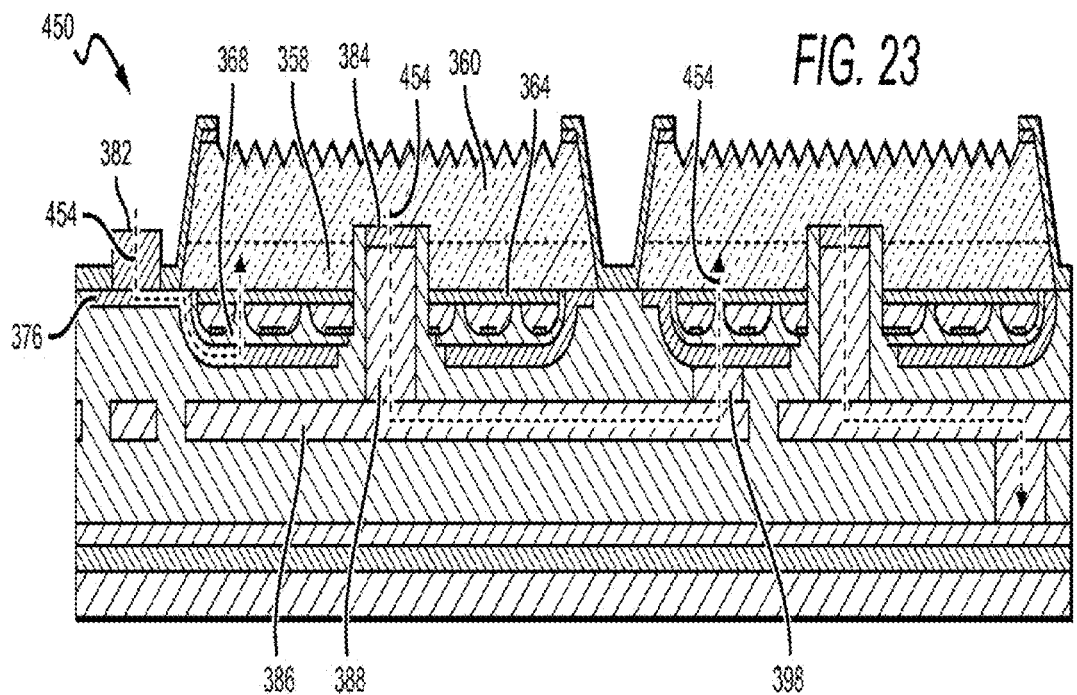
FIG. 23 is a sectional view of the LED chip in FIG. 22 showing flow of an electrical signal.

The LED chip 350 shown in FIGS. 20 and 21 comprises a lateral geometry in that electrical signals can be applied to the LED chip 350 at p-contact 382 and n-contact pad 400 accessible from the top surface of the LED chip. In other embodiments the LED chip 350 can comprise different contact geometries and arrangements. FIGS. 22 and 23 show another embodiment of an LED chip 450 according to the present invention having many of the same features as the LED chip 350, but having internal conductive features to provide a vertical geometry chip. The LED chip does not have an n-contact pad on its top surface, but instead a substrate via 452 that passes from the interconnection metal layer 386, down and through the insulation layer 396, to the layers below. In embodiments where the substrate 390, bond metal layer 392, and blanket mirror 394 comprise electrically conductive materials, the substrate vias 452 can extend to the blanket mirror 452. An electrical signal applied to the substrate 390 would conduct to the substrate via 452. In embodiments where one of these layers does not have the desired electrical conductivity, the can pass further through the different layers. For example, if the substrate 390 is not electrically conductive, the substrate vias 452 can pass through the substrate 390 so that it is accessible at the bottom of the LED chip 450. One or more contact layers or pads (not shown) can also be included on the bottom of the LED for making electrical contact.

Referring now to FIG. 23, an electrical signal passes through the LED chip 450 as shown by arrows 454, and has much the same path as that shown for LED chip 350 in FIG. 21. An electrical signal is applied to the p-contact pad 382 and is conducted through the barrier layer 376, metal layer 368, and current spreading layer 364, to the p-type layer 358. The signal then passes through to the n-type layer 360 where it passes through to the n-contact 384 and the n-type vias 388. The signal then conducts along the interconnection metal layer 386 where it passes into the first of the p-type vias 398. The signal is then conducted to the p-type layer 358 in the second active region 352, where it passes into the n-type layer 360, n-contact 384 and n-type vias 388. The signal then passes on to the next of the active regions 352 connected in series and this continues until the last of the active regions 352. At the last of the active regions 352, the electrical signal at the n-type vias 388 passes into the interconnection metal layer 386 and to the substrate vias where it passes to the substrate 390. This type of an electrical signal to be applied to the LED chip at the top surface (p-contact pad 382) and the bottom surface (substrate 390) in a vertical geometry type arrangement.

It is understood that the above are only examples of different interconnection and contacting arrangements according to the present invention. Other embodiments can have different internal interconnection arrangements and other embodiment can be arranged so that an electrical signal is applied to the LED chip at the bottom surface.

Figure 24:
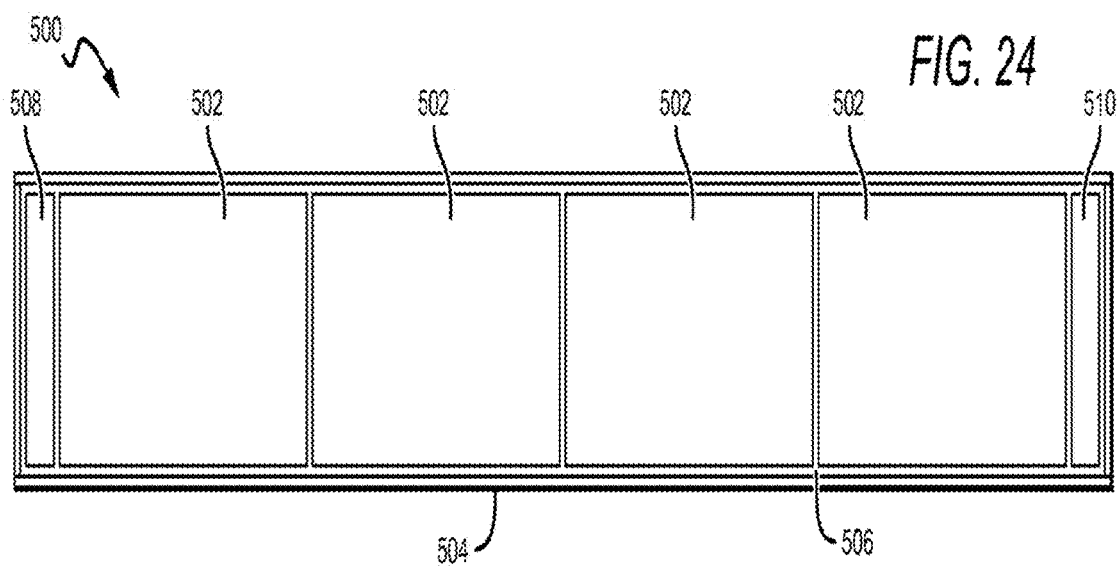
FIG. 24 is a plan view of an monolithic emitter according to the present invention.

The monolithic LED chips can be used in many different applications and can be arranged in many different ways. FIG. 24 shows one embodiment of a monolithic LED chip 500 according to the present invention that comprises four active regions 502 arranged on a single submount 504. The LED chip 500 can have many different shapes and sizes, with the emitter shown having a rectangular shape. Each of the active regions 502 can also have a generally rectangular footprint, with a small space 506 formed between adjacent ones of the active regions 502. The space 506 is shown as being in a straight line, but it is understood that the space can have curves or can be squiggly. The space 506 can be formed using known methods such as different etch or cut methods. A p-contact pad 508 is arranged at one end of the emitter 500 and the n-contact pad 510 is arranged at the opposite end. A signal applied to the p-contact pad conducts through the device to the re-contact as described above.

The different embodiments of the devices described herein can have many advantages. The rectangular embodiment can be sized to mimic the emission of a filament in a convention light source. By interconnecting the active regions in series, a high voltage light source can be provided that is compatible with many conventional lighting applications. In the embodiment shown, the emitter 450 has four active regions each having a 3 volt junction. This results in the LED chip 450 comprising a 12 volt light source. Different numbers of LEDs can result in emitters that operate from different voltages. For example, a similarly arranged emitter with six active regions comprises a 24 volt light source.

By providing a monolithic device formed on a single substrate instead of discrete LED chips or packages on a submount, the space between adjacent active regions can be minimized. This minimizes or eliminates the undesirable dark spaces between adjacent ones of the active regions, giving the emitter the appearance of a continuous filament.

Figure 25:
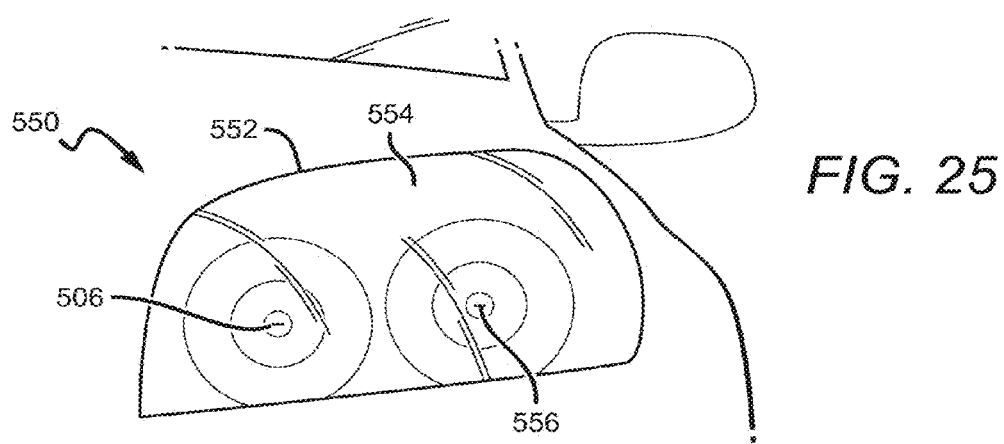
FIG. 25 is a front view of one embodiment of a car headlight according to the present invention.

The monolithic emitters can be used in many different lighting fixtures, including but not limited to lamps, bulbs, flashlight, streetlights, automobile headlights, etc. FIG. 25 shows one embodiment of a car headlight 550 according to the present invention having a housing 552, with an opening having a light transmitting cover/lens 554. The headlight has one or more monolithic LED chips 556 mounted in the housing so that light from LED chips emits out the housing opening through the lens/cover. Many different monolithic LED chips can be used with many different numbers of active regions, with some embodiments using a four active region monolithic LED chip operating from a 12v electrical signal.

Although the present invention has been described in detail with reference to certain preferred configurations thereof, other versions are possible. Therefore, the spirit and scope of the invention should not be limited to the versions described above.

We claim:

1. A monolithic LED chip, comprising:
    a plurality of active regions on a submount;
    integral electrically conductive interconnect elements in electrical contact with said plurality of active regions and electrically connecting at least some active regions of said plurality of active regions in parallel or in series-parallel, wherein said interconnect elements are completely embedded within said submount; and
    one or more integral insulating layers surrounding at least a portion of said interconnect elements and isolating said at least a portion of said interconnect elements from other elements of said monolithic LED chip.

2. The monolithic LED chip of claim 1, wherein said interconnect elements and said one or more integral insulating layers are integral to said submount.

3. The monolithic LED chip of claim 1, wherein said interconnect elements and said one or more integral insulating layers are integral to said plurality of active regions.

4. The monolithic LED chip of claim 1, wherein said interconnect elements comprise a metal layer and a plurality of electrically conductive vias.

5. The monolithic LED chip of claim 1, wherein said submount further comprises lower electrically conductive elements, wherein one insulating layer of said one or more integral insulating layers is arranged between (i) said lower electrically conductive elements and (ii) said interconnect elements and said plurality of active regions.

6. The monolithic LED chip of claim 5, wherein said lower electrically conductive elements comprise a mirror and/or a bond metal.

7. The monolithic LED chip of claim 1, wherein at least some adjacent active regions of said plurality of active regions are separated from one another by a space that is substantially not visible when said monolithic LED chip is emitting.

8. The monolithic LED chip of claim 1, wherein at least some adjacent active regions of the plurality of active regions are separated from one another by a space that is 10 percent or less of a width of one or more active regions of said at least some adjacent active regions.

9. The monolithic LED chip of claim 1, wherein said plurality of active regions is formed separately from said submount and is mounted on said submount.

10. A monolithic LED chip, comprising:
    a plurality of active regions on a submount and configured to emit light, wherein at least some active regions of said plurality of active regions are interconnected in parallel or series-parallel with at least one parallel or series-parallel interconnection extending entirely within an interior of said monolithic LED chip without being exposed along an outer surface of said monolithic LED chip, and wherein at least some adjacent active regions of said plurality of active regions are separated from one another by a space that is 10 percent or less of a width of one or more active regions of said at least some adjacent active regions, such that said space is substantially not visible when said monolithic LED chip is emitting.

11. The monolithic LED chip of claim 10, wherein said space is 2.5% or less of the width of the one or more active regions of said at least some adjacent active regions.

12. The monolithic LED chip of claim 11, wherein said space is 1.5% or less of the width of the one or more active regions of said at least some adjacent active regions.

13. The monolithic LED chip of claim 10, wherein the at least one parallel or series-parallel interconnection comprises a plurality of integral electrically conductive interconnect elements in electrical contact with said at least some adjacent active regions.

14. The monolithic LED chip of claim 13, wherein said plurality of integral electrically conductive interconnect elements comprises a metal layer and a plurality of electrically conductive vias.

15. The monolithic LED chip of claim 13, wherein said submount comprises an integral insulator element electrically insulating at least some electrically conductive interconnect elements of said plurality of integral electrically conductive interconnect elements and said at least some adjacent active regions from portions of said submount.

16. The monolithic LED chip of claim 15, wherein at least a portion of said plurality of integral electrically conductive interconnect elements is buried in said integral insulator element.

17. The monolithic LED chip of claim 15, wherein said integral insulator element comprises one or more insulation layers.

18. A light source, comprising:
    a housing defining an opening; and
    a monolithic LED chip mounted within said housing and configured to transmit LED emissions out of said opening, said monolithic LED chip comprising:
    a plurality of active regions mounted on a submount, with each active region of the plurality of active regions in close proximity to at least one other active region of the plurality of active regions, such that adjacent active regions of the plurality of active regions are separated from one another by a space that is substantially not visible when said adjacent active regions are emitting; and a plurality of electrical connections extending between active regions of the plurality of active regions and completely within said submount without being exposed along an outer surface of said monolithic LED chip, wherein the plurality of electrical connections serve to electrically connect at least some active regions of the plurality of active regions in parallel or in series-parallel.

19. The light source of claim 18, wherein the LED emissions of said monolithic LED chip are similar to light emissions of a filament.

20. The light source of claim 18, wherein said space is 10 percent or less of a width of one or more active regions of said adjacent active regions.

21. The light source of claim 20, wherein said space is 5% or less of the width of the one or more active regions of said adjacent active regions.

22. The light source of claim 18, wherein the plurality of electrical connections comprises a metal layer and a plurality of electrically conductive vias.

23. The light source of claim 18, wherein said plurality of electrical connections comprises a plurality of integral electrically conductive interconnect elements, and said submount comprises an integral insulator element electrically insulating at least some integral electrically conductive interconnect elements of said plurality of integral electrically conductive interconnect elements and said plurality of active regions from portions of said submount.

24. The light source of claim 23, wherein said integral insulator element comprises one or more insulation layers.

25. A monolithic LED chip, comprising:
a plurality of active regions on a submount that includes integral electrically insulating elements; and
integral electrically conductive interconnect elements forming at least one parallel or series-parallel connection extending between adjacent active regions of the plurality of active regions, wherein the at least one parallel or series-parallel connection is at least partially embedded in the integral electrically insulating elements and is entirely embedded in said submount without being exposed along an outer surface of said monolithic LED chip.

* * * * *

UNITED STATES PATENT AND TRADEMARK OFFICE
CERTIFICATE OF CORRECTION

PATENT NO. : 10,115,860 B2
APPLICATION NO. : 15/647823
DATED : October 30, 2018
INVENTOR(S) : Kevin W. Haberern et al.

Page 1 of 1

It is certified that error appears in the above-identified patent and that said Letters Patent is hereby corrected as shown below:

In the Specification

In Column 1, Line 62, replace "until finds" with --until it finds--.

In Column 12, Lines 52 and 53, replace "the re-contact" with --the n-contact--.

In Column 16, Line 30, replace "an re-contact" with --an n-contact--.

In Column 21, Lines 35 and 39, replace "the re-contact" with --the n-contact--.

In Column 21, Line 52, replace "re-contact 384" with --n-contact 384--.

In Column 23, Line 2, replace "the re-contact" with --the n-contact--.

Signed and Sealed this
Eleventh Day of December, 2018

Andrei Iancu
*Director of the United States Patent and Trademark Office*